(12) United States Patent
Lee et al.

(10) Patent No.: US 11,495,624 B2
(45) Date of Patent: Nov. 8, 2022

(54) DISPLAY DEVICE

(71) Applicant: Samsung Display Co., LTD., Yongin-si (KR)

(72) Inventors: Ju Hyun Lee, Seongnam-si (KR); Gyung Min Baek, Yongin-si (KR); Do Keun Song, Yongin-si (KR); Hyun Eok Shin, Gwacheon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 122 days.

(21) Appl. No.: 17/144,210

(22) Filed: Jan. 8, 2021

(65) Prior Publication Data

US 2021/0375943 A1 Dec. 2, 2021

(30) Foreign Application Priority Data

Jun. 2, 2020 (KR) .................. 10-2020-0066614

(51) Int. Cl.
*H01L 27/12* (2006.01)
*G09G 3/20* (2006.01)

(52) U.S. Cl.
CPC ............. *H01L 27/124* (2013.01); *G09G 3/20* (2013.01); *G09G 2300/0426* (2013.01); *G09G 2310/0275* (2013.01)

(58) Field of Classification Search
None
See application file for complete search history.

(56) References Cited

U.S. PATENT DOCUMENTS

| 11,146,745 | B2* | 10/2021 | Siala | ................ G01S 17/89 |
| 2018/0213071 | A1 | 7/2018 | Bao | |
| 2018/0219058 | A1* | 8/2018 | Xiang | ................ H01L 27/3225 |
| 2021/0405954 | A1* | 12/2021 | Li | ................ G09G 5/377 |

FOREIGN PATENT DOCUMENTS

| CN | 206451466 U | 8/2017 |
| KR | 1020170103159 A | 9/2017 |
| KR | 1020170113066 A | 10/2017 |
| KR | 1020190091711 A | 8/2019 |
| KR | 1020190119960 A | 10/2019 |

* cited by examiner

*Primary Examiner* — Nicholas J Lee
(74) *Attorney, Agent, or Firm* — Cantor Colburn LLP

(57) ABSTRACT

A display device includes: a substrate including a first display area and a second display area; an optical element which overlaps the second display area; a semiconductor layer disposed on the substrate; a first insulation layer disposed to cover the semiconductor layer; a gate conductor disposed on the first insulation layer; a second insulation layer disposed to cover the gate conductor; a data conductor disposed on the second insulation layer; a third insulation layer disposed to cover the data conductor; and a pixel electrode disposed on the data conductor. The data conductor disposed in the first display area includes an opaque conductor, and a part of the data conductor disposed in the second display area is a transparent conductor.

20 Claims, 14 Drawing Sheets

DISPLAY DEVICE

This application claims priority to Korean Patent Application No. 10-2020-0066614, filed on Jun. 2, 2020, and all the benefits accruing therefrom under 35 U.S.C. § 119, the content of which in its entirety is herein incorporated by reference.

BACKGROUND

1. Field

The disclosure relates to a display device including an optical element.

2. Description of the Related Art

A display device may include an optical element such as a sensor, a camera, or the like. In such a display device, the optical element may be dispose in a bezel area (area surrounding a screen) of the display device to avoid interference with the screen.

When the bezel of the display device is reduced, a screen-to-body ratio of the display device, that is, a ratio occupied by the screen when the display device is viewed from a front, may be increased. It is desired to increase the scree-to-body ratio of the display device in the market.

SUMMARY

In a display device including an optical element, as a bezel of the display device is reduced, it is difficult to dispose the optical element in a bezel area, and thus it is desired to develop a technology to dispose the optical element in a screen area.

Embodiments are directed to a display device including an optical element with improved resolution and transmittance by disposing the optical element in a screen area.

An embodiment of a display device includes: a substrate including a first display area and a second display area; an optical element which overlaps the second display area; a semiconductor layer disposed on the substrate; a first insulation layer disposed to cover the semiconductor layer; a gate conductor disposed on the first insulation layer; a second insulation layer disposed to cover the gate conductor; a data conductor disposed on the second insulation layer; a third insulation layer disposed to cover the data conductor; and a pixel electrode disposed on the data conductor, where the data conductor disposed in the first display area is an opaque conductor, and a part of the data conductor disposed in the second display area is a transparent conductor.

In an embodiment, the data conductor in the second display area may include a source connection portion, a drain connection portion and a wiring portion, which are connected to the semiconductor layer, and the wiring portion may be the transparent conductor.

In an embodiment, the transparent conductor may have a triple layer structure including an upper layer, an intermediate layer and a lower layer, the upper layer and the lower layer may include at least one selected from indium tin oxide ("ITO"), indium zinc oxide ("IZO"), indium gallium zinc oxide ("IGZO"), aluminum zinc oxide ("AZO"), gallium zinc oxide ("GZO"), and indium tin zinc oxide ("ITZO"), and the intermediate layer may include at least one selected from silver (Ag), copper (Cu) and aluminum (Al).

In an embodiment, a thickness of the intermediate layer is about 300 angstrom (Å) or less.

In an embodiment, each of the source connection portion and the drain connection portion may have a triple layer structure in each of which an upper layer and a lower layer include titanium (Ti), and an intermediate layer includes aluminum (Al).

In an embodiment, the pixel electrode may have the triple layer including the upper layer, the intermediate layer, and the lower layer.

In an embodiment, the gate conductor may have the triple layer structure including the upper layer, the intermediate layer, and the lower layer.

In an embodiment, the data conductor in the first display area may have a triple layer in which an upper layer and a lower layer include titanium (Ti), and an intermediate layer includes aluminum (Al).

In an embodiment, the second display area may include a transmittance region.

An embodiment of a display device includes: a substrate including a first display area and a second display area; an optical element which overlaps the second display area; a scan line disposed on the substrate and extending in a first direction; a data line and a driving voltage line which extend in a second direction perpendicular to the first direction; a driving transistor including a first electrode electrically connected to the driving voltage line, and a first gate electrode; a second transistor including a first electrode connected to the data line; and a pixel electrode electrically connected with the driving transistor, where the data line and the driving voltage line disposed in the first display area include an opaque conductor, and at least one selected from the data line and the driving voltage line disposed in the second display area is a transparent conductor.

In an embodiment, the data line in the second display area may include a wiring portion extending in the second direction, and a second transistor connection portion connected to the first electrode of the second transistor.

In an embodiment, the wiring portion of the data line may be the transparent conductor, and the second transistor connection portion of the data line may include the opaque conductor.

In an embodiment, the display device may further include a third transistor including a first electrode connected to the driving voltage line.

In an embodiment, the driving voltage line may include a horizontal wiring portion extending in the first direction, a vertical wiring portion extending in the second direction, an electrode island connection portion, a sustain electrode connection portion, and a fifth transistor connection portion.

In an embodiment, the horizontal wiring portion and the vertical wiring portion of the driving voltage line may include the transparent conductor, and the electrode island connection portion, the sustain electrode connection portion and the fifth transistor connection portion may include the opaque conductor.

In an embodiment, the horizontal wiring portion may be electrically connected to the sustain electrode connection portion by directly contacting the horizontal wiring portion.

In an embodiment, the sustain electrode may form a storage capacitor with the first gate electrode, and an insulation layer interposed therebetween.

In an embodiment, the vertical wiring portion may include a first vertical wiring portion and a second vertical wiring portion, the first vertical wiring portion may be electrically connected to the electrode island connection portion by directly contacting the electrode island connection portion, and the second vertical wiring portion may be electrically connected to the third transistor connection portion by directly contacting the third transistor connection portion.

In an embodiment, the electrode island connection portion may be electrically connected to an electrode island through an opening in an insulation layer.

In an embodiment, the third transistor connection portion may be electrically connected to a first electrode of the third transistor through an opening in an insulation layer.

According to embodiments, an optical element is disposed in a screen in a display device including the optical element, and a part of wiring of a pixel area overlapping the optical element includes a transparent conductor, thereby improving resolution and transmittance of the display device.

DETAILED DESCRIPTION

Figure 1:
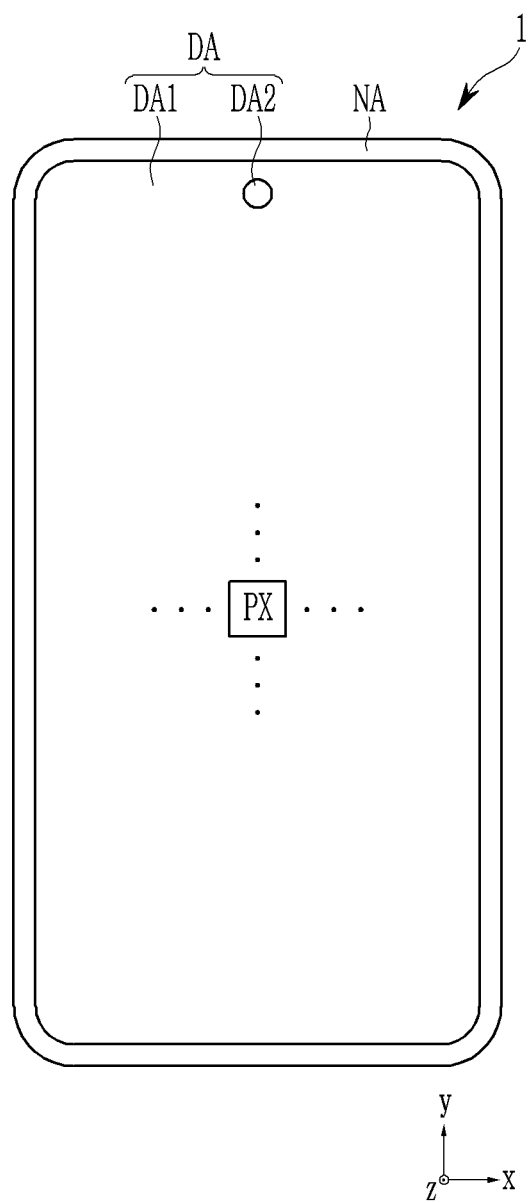
FIG. 1 is a schematic top plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

In addition, since the size and thickness of each component shown in the drawings are arbitrarily shown for better understanding and ease of description, the invention is not necessarily limited to what is shown. In the drawings, the thickness of layers, films, panels, regions, etc., are exaggerated for clarity. In addition, in the drawings, for better understanding and ease of description, the thickness of some layers and regions is exaggerated.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "on a plane" means viewing a target portion from a top, and the phrase "on a cross-section" means viewing a cross-section formed by vertically cutting a target portion from a side.

In drawings, x-axis used to indicate a direction is a first direction, y-axis is a second direction perpendicular to the first direction, and z-axis is a third direction perpendicular to the first direction and the second direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, referring to FIG. 1 and FIG. 2, a display device according to embodiments will be described. In such embodiment, the display device may be a light emitting display device.

Figure 2:
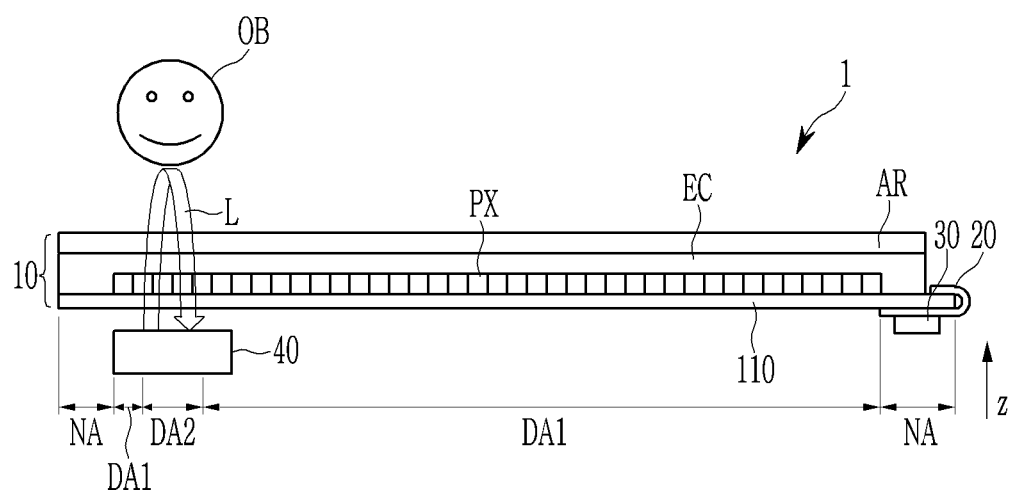
FIG. 2 is a schematic cross-sectional view of the display device according to an embodiment.

FIG. 1 is a schematic top plan view of a display device according to an embodiment, and FIG. 2 is a schematic cross-sectional view of the display device according to an embodiment.

Referring to FIG. 1 and FIG. 2, an embodiment of a display device 1 includes a driving apparatus that includes a display panel 10 and a flexible printed circuit board 20 connected to the display panel 10, and an optical element 40.

The display panel 10 may include a display area DA where an image is displayed, and a non-display area NA disposed to surround the display area DA and where an image is not displayed. The display area DA may correspond to a screen.

A plurality of pixels PX are disposed in the display area DA. Here, the pixel PX is a minimum unit for displaying an image, and each pixel PX may display one of specific colors, e.g., red, green, and blue, with various luminance corresponding to an input image signal.

In such an embodiment, circuits and/or signal lines for generating and/or transmitting various signals applied to the display area DA are disposed in the non-display area NA. Each pixel PX is connected with signal lines such as a gate line, a data line, a driving voltage line, or the like, and thus may receive a gate signal, a data voltage, a driving voltage, or the like through the signal lines.

The display area DA includes a first display area DA1 and a second display area DA2. The second display area DA2 has higher transmittance than the first display area DA1 for another function other than an image display function. Here, the transmittance implies transmittance of light from the display panel 10 in a third direction (i.e., the z-axis direction or a thickness direction of the display panel 10). The light may be visible light and/or light having a wavelength other than visible light, such as infrared light. Density of pixels PX in the second display area DA2 may be lower than density of pixels PX in the first display area DA1, that is, the number of pixels PX per unit area of the second display area DA2 is less than the number of pixels PX per unit area of the first display area DA1.

The second display area DA2 may be variously defined in the display area DA. In an embodiment, as shown in FIG. 1, the second display area DA2 may be disposed in the first display area DA1 and surrounded by the first display area DA1.

In an embodiment, the second display area DA2 may be disposed adjacent or contacting the non-display area NA. The second display area DA2 may be located at the left, right, and/or a center of the display area DA at an upper end thereof. The second display area DA2 may be divided into two or more regions. In one embodiment, for example, the second display area DA2 may be disposed along a first direction (x-axis direction) completely across the upper end of the display area DA. Alternatively, the second display area DA2 may be disposed along a second direction (y-axis direction) across the left and/or right ends of the display area DA. The second display area DA2 may have various shapes such as polygons such as quadrangles and triangles, circles, and ellipses. In an embodiment, the shape and the arrangement of the second display area DA2 is not limited those described above, and may be variously modified.

A driving unit that generates and/or processes various signals for driving the display panel 10 may be positioned in the non-display area NA of the display panel 10. The driving unit includes a data driver that applies a data voltage to the data line, a gate driver that applies a gate signal to the gate line, and a signal controller that controls the data driver and the gate driver.

The drivers may be integrated with the display panel 10, or may be disposed at horizontally opposite sides or one side of the display area DA. The data driver and the signal controller may be provided as an integrated circuit ("IC") chip (also referred to as a driving IC chip) 30, and the IC chip 30 may be disposed or mounted on flexible printed circuit board 20 and electrically connected to display panel 10. Alternatively, the IC chip 30 may be mounted on the non-display area NA of the display panel 10.

In an embodiment, as shown in FIG. 2, the display panel 10 may include a substrate 110, and a plurality of pixels PX may be disposed on the substrate 110. The substrate 110 may include a first display area DA1 and a second display area DA2.

The display panel 10 may include an encapsulation layer EC that wholly covers the pixels PX. The encapsulation layer EC encapsulates the first display area DA1 and the second display area DA2 to prevent permeation of moisture or oxygen into the display panel 10. In an embodiment where the encapsulation layer EC is in a form of a substrate, the substrate 110 and the encapsulation layer EC may be bonded by a sealing member. An anti-reflection layer AR may be disposed on the encapsulation layer EC to reduce reflection of external light, and the anti-reflection layer AR may include a polarization layer and/or a phase delay layer.

An optical element 40 may be located at a rear side of the display panel 10. The optical element 40 may be a sensor, a camera, a flash, or the like. In an embodiment, where the optical element 40 is a sensor, the optical element 40 may be a proximity sensor or an illuminance sensor. Light at a wavelength used by the optical element 40 may pass through the second display area DA2 of the display panel 10 with higher transmittance. In such an embodiment, various electronic devices, in addition to the optical element 40, may be positioned on the rear side of the display panel 10.

The optical element 40 may emit light L having a certain wavelength range toward an object OB positioned on a front side of the display panel 10 or receive light L reflected from the object OB. The light L of such a certain wavelength range is light of a wavelength that may be processed by the optical element 40, and may be visible light and/or infrared light. The light of the certain wavelength may mainly pass through a transmission area positioned in the second display area DA2. In an embodiment, where the optical element 40 uses infrared light, light of a certain wavelength may have a wavelength in a range of about 900 nanometers (nm) to about 1000 nm. The optical element 40 may receive light of a certain wavelength irradiated to the front of the display panel 10. The optical element 40 may be disposed corresponding to (or to overlap in the z-axis direction) the entire second display area DA2, and may be disposed corresponding to only a part of the second display area DA2. In an embodiment, a plurality of optical elements 40 may be disposed in the second display area DA2.

Hereinafter, the first display area DA1 and the second display area DA2 of the display device according to an embodiment will be described in greater detail with reference to FIGS. 3 to 5, together with FIG. 1 and FIG. 2.

Figure 3:
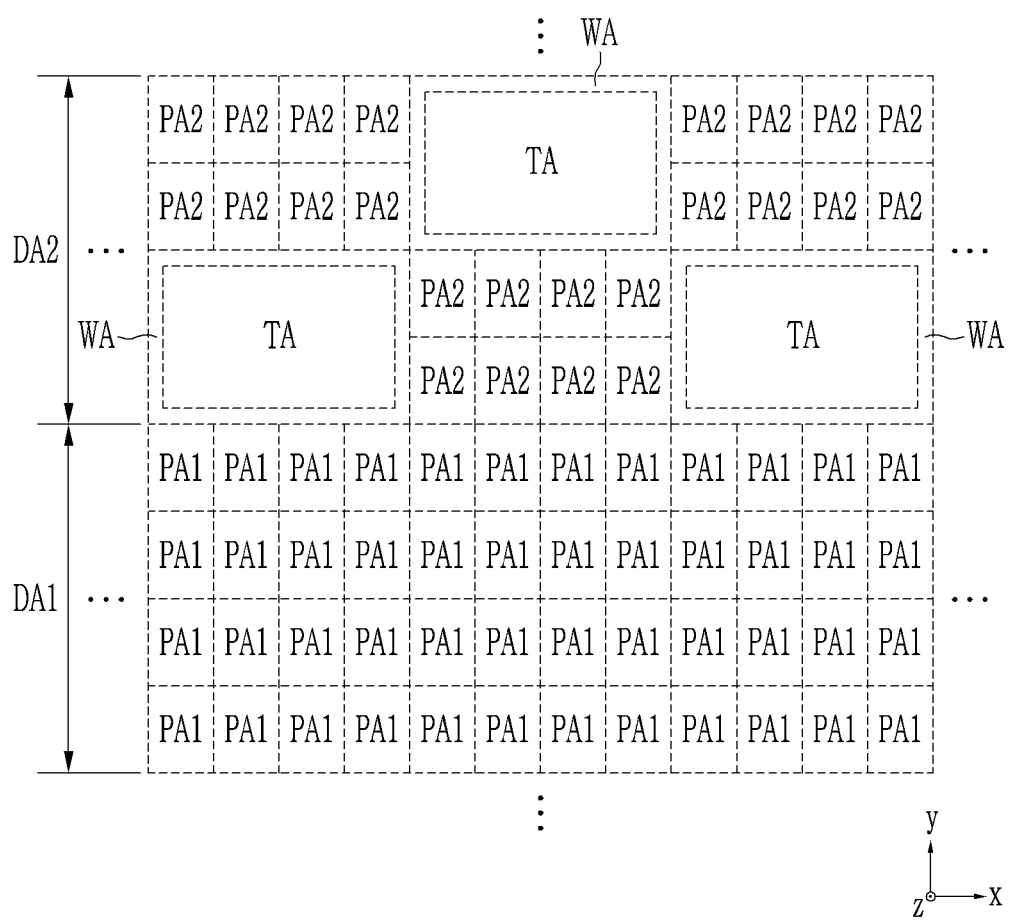
FIG. 3 is a schematic plan view of the first display area and the second display area of the display device according to an embodiment.
Figure 4:
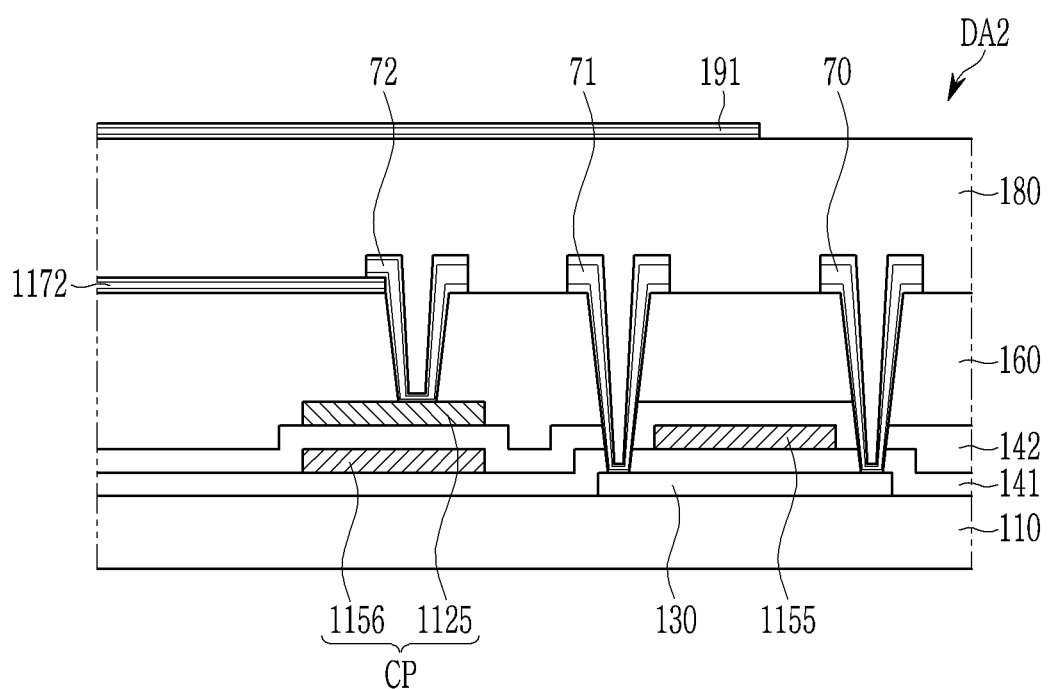
FIG. 4 is a cross-sectional view of a part of the second display area of the display device according to an embodiment.
Figure 5:
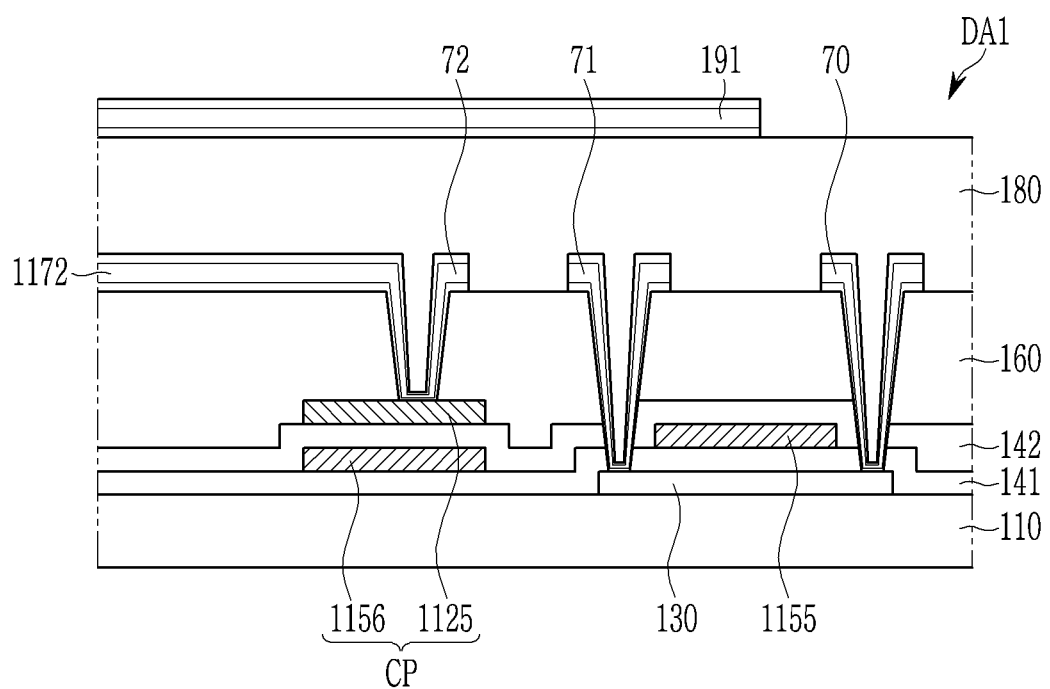
FIG. 5 is a cross-sectional view of a part of the first display area of the display device according to an embodiment.

FIG. 3 is a schematic plan view of the first display area and the second display area of the display device according to an embodiment, FIG. 4 is a cross-sectional view of a part of the second display area of the display device according to an embodiment, and FIG. 5 is a cross-sectional view of a part of the first display area of the display device according to an embodiment.

Referring to FIG. 3, in an embodiment, the first display area DA1 includes a plurality of first pixel areas PA1, and the second display area DA2 includes a plurality of second pixel areas PA2, a plurality of transmission areas TA, and a plurality of wiring areas WA disposed between (or defined at a boundary area between) the plurality of second pixel areas PA2 and the plurality of transmission area TA. The plurality of wiring areas WA are respectively disposed to surround the plurality of transmission areas TA.

A size of one first pixel area PA1 and a size of one second pixel area PA2 may be to the same as or different from each other.

In the first display area DA1, the first pixel areas PA1 may be arranged in a matrix form along a first direction x and a second direction y, which are different directions.

In the second display area DA2, the second pixel areas PA2 and the transmission areas TA may be arranged in a matrix form. In an embodiment, the second pixel areas PA2 and the transmission areas TA may be arranged in a checkerboard pattern so that the second pixel areas PA2 and the transmission areas TA may be evenly distributed or mixed. In such an embodiment, the transmission area TA is adjacent in the first direction x and the second direction y at the periphery of one second pixel area PA2, and the second pixel areas PA2 may be adjacent in the first direction x and the second direction y at the periphery of one transmission areas TA. One or more second pixel areas PA2 and one or more transmission areas TA may be alternately arranged in the first direction x or the second direction y. In an alternative embodiment, only the second pixel areas PA2 may be continuously arranged without the transmission area TA in the second display area DA2.

Each transmission areas TA may have a same size as or may have a different size from each other. The arrangement and the size of the second pixel areas PA2 and transmission areas TA may be variously modified.

Each of the pixel areas PA1 and PA2 may include at least one pixel PX. The pixel PX may include a pixel circuit and a light emitting portion. In an embodiment, the pixel circuit, which is a circuit for driving a light emitting element such as a light emitting diode LED (shown in FIG. 13), may include a transistor, a capacitor, or the like. The light emitting portion is an area where light is emitted from the light emitting element.

Referring to FIG. 4 and FIG. 5, an embodiment of the display device includes a semiconductor layer 130, a first insulation layer 141, a first gate conductor, a second insulation layer 142, a second gate conductor, a third insulation layer 160, a data conductor, a planarization layer 180, and a pixel electrode 191 on the substrate 110. FIG. 4 may be a cross-section corresponding to a part of the second pixel area PA2 of FIG. 3, and FIG. 5 may be a cross-section corresponding to a part of the first pixel area PA1 of FIG. 3. Hereinafter, a transparent conductor implies a conductor that transmits light, and an opaque conductor implies a conductor that mostly does not transmit light. The transparent conductor may include a transparent conductive material such as an indium tin oxide ("ITO", InSnO), an indium zinc oxide ("IZO", InZnO), or the like. In addition, the transparent conductor may have a thickness that is appropriate or thin enough to transmit light when including an opaque metal such as aluminum (Al), copper (Cu), or the like, and thus may substantially entirely transmit light. The transparent conductor may be a single layer, a double layer, or a triple layer depending on the type of metallic material included therein, and each layer include or is formed of a transparent conductor. The transparent conductor and the opaque conductor may be determined based on the included material. In an embodiment, where the transparent conductor and the opaque conductor includes a same material as each other, the transmittance may be determined based the thickness of the metal layer. In one embodiment, for example, where the opaque metal layer has a thin thickness, the opaque metal layer may be implemented as a transparent metal body. The data conductor shown in FIG. 4 includes a part of a transparent conductor, while the data conductor shown in FIG. 5 includes the entirely opaque conductor, and this will be described in detail.

The substrate 110 may include an insulating material such as a polymer such as polyimide or polyamide, or a glass, and may be optically transparent. In an embodiment where the substrate 110 includes a polymer layer, the substrate 110 may include a barrier layer (not shown) including an organic insulation material such as a silicon oxide (SiOx) or a silicon nitride (SiNx) to prevent permeation of moisture or the like.

The semiconductor layer 130 is disposed on the substrate 110. The semiconductor layer 130 may include a channel region, a source region, and a drain region. The source region and the drain region may be disposed or provided at opposite sides of the channel region. The semiconductor layer 130 may include a semiconductor material such as polysilicon, amorphous silicon, an oxide semiconductor, or the like. In an embodiment, a buffer layer (not shown) may be disposed between the substrate 110 and the semiconductor layer 130 to prevent diffusion of an impurity that degrades the characteristics of the semiconductor layer 130 and to prevent penetration of moisture.

The first insulation layer 141 including an inorganic insulation material is disposed on the semiconductor layer 130.

A first gate conductor that includes a gate electrode 1155 of a transistor, a first electrode 1156 of a capacitor CP, and a gate line (not shown) is disposed on the first insulation layer 141. The gate electrode 1155 overlaps the channel region of the semiconductor layer 130.

The first gate conductor shown in FIG. 4 may be a single layer or a multilayer including a metal such as molybdenum (Mo), copper (Cu), aluminum (Al), silver (Ag), chromium (Cr), tantalum (Ta), or titanium (Ti). In one embodiment, for example, the first gate conductor may have a triple layer structure or be formed of a triple layer including a transparent conductor. In such an embodiment, an upper layer may include at least one of ITO, IZO, indium gallium zinc oxide ("IGZO", InGaZnO), aluminum zinc oxide ("AZO", AlZnO), gallium-zinc oxide ("GZO", GaZnO), and indium tin zinc oxide ("ITZO", InSnZnO), an intermediate layer may include at least one selected from silver (Ag), aluminum (Al) and copper (Cu), and a lower layer may include at least one of ITO, IZO, IGZO, AZO, GZO, and ITZO. A thickness of the intermediate layer may be about 300 angstrom (Å) or less. In one embodiment, for example, the thickness of the intermediate layer may be about 200 Å such that the external light may be effectively transmitted therethrough.

In an embodiment of the display device, the first gate conductor located in the second display area DA2 may be a triple layer of which an upper layer includes ITO, an intermediate layer includes silver (Ag), and a lower layer includes ITO. Since the upper layer and the lower layer of the first gate conductor include a transparent conductor (e.g., ITO) and the intermediate layer thereof includes silver (Ag) with a thickness of about 200 Å, the entire first gate conductor may be a transparent conductor. Accordingly, the first gate conductor may have high transmittance for external light from the lower part of the substrate 110 in the second display area DA2.

In an embodiment, the first gate conductor shown in FIG. 5 may be a single layer or a multilayer including a metal such as molybdenum (Mo), copper (Cu), aluminum (Al), silver (Ag), chromium (Cr), tantalum (Ta), titanium (Ti), or the like.

A second insulation layer 142 is disposed on the first gate conductor to cover the first insulation layer 141 and the first gate conductor. The second insulation layer 142 may include an inorganic insulating material.

A second gate conductor including a second electrode 1125 of the capacitor CP is disposed on the second insulation layer 142.

The second gate conductor shown in FIG. 4 may be a single layer or a multilayer including a metal such as molybdenum (Mo), copper (Cu), aluminum (Al), silver (Ag), chromium (Cr), tantalum (Ta), or titanium (Ti). In one embodiment, for example, the second gate conductor may have a triple layer structure or be formed of a triple layer including a transparent conductor. In such an embodiment, an upper layer may include at least one selected from ITO, IZO, IGZO, GZO and ITZO, an intermediate layer may include at least one selected from silver (Ag), aluminum (Al) and copper (Cu), and a lower layer may include at least one selected from ITO, IZO, IGZO, AZO, GZO and ITZO. In such an embodiment, a thickness of the intermediate layer may be about 300 Å or less. In one embodiment, the thickness of the intermediate layer may be about 200 Å such that the external light may be effectively transmitted therethrough.

In such an embodiment of the display, a second gate conductor disposed in the second display area DA2 may be a tripe layer of which an upper layer includes ITO, an intermediate layer includes silver (Ag), and a lower layer includes ITO. In such an embodiment, the upper layer and the lower layer of the second gate conductor include a transparent conductor (e.g., ITO), and the intermediate layer of the second gate conductor includes silver (Ag), and the second gate conductor has a thickness of about 200 Å such that the second gate conductor may be an entirely (or substantially high) transparent conductor. Accordingly, the second gate conductor may have increased transmittance for external light from the lower part of the substrate 110 in the second display area DA2.

In an embodiment, the second gate conductor shown in FIG. 5 may be a single layer or a multilayer including a metal such as molybdenum (Mo), copper (Cu), aluminum (Al), silver (Ag), chromium (Cr), tantalum (Ta), or titanium (Ti).

A third insulation layer 160 is disposed to cover the second insulation layer 142 and the second gate conductor on the second insulation layer 142. The third insulation layer 160 may include an organic insulating material.

In an embodiment, a data conductor that includes a source electrode 70 and a drain electrode 71 of the transistor, a capacitor connection portion 72, and a wiring portion 1172, which is a part of the data line, the driving voltage line, and the like is disposed on the third insulation layer 160. The source electrode 70 and the drain electrode 71 may be respectively connected to a source region and a drain region of the semiconductor layer 130 through an opening defined through the second insulation layer 142. In such an embodiment, the source electrode 70 and the drain electrode 71 may be a source connection portion and a drain connection portion.

In such an embodiment, the source electrode 70 and the drain electrode 71 may be a single layer or a multilayer including a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta). In one embodiment, for example, the source electrode 70 and the drain electrode 71 may be a triple layer of which an upper layer includes titanium (Ti), an intermediate layer includes aluminum (Al), and a lower layer includes titanium (Ti). The source electrode 70 and the drain electrode 71 may be opaque conductors that do not transmit most of the light.

In an embodiment, the wiring portion 1172 shown in FIG. 4 may have a triple layer structure or be formed of a triple layer including a transparent conductor. In such an embodiment, an upper layer of the wiring portion 1172 may include at least one selected from ITO, IZO, IGZO, AZO, GZO and ITZO, an intermediate layer may include at least one selected from silver (Ag), aluminum (Al) and copper (Cu), and a lower layer may include at least one selected from ITO, IZO, IGZO, AZO, GZO and ITZO. In such an embodiment, a thickness of the intermediate layer may be about 300 Å or less. In one embodiment, for example, the thickness of the intermediate layer may be about 200 Å such that the external light may be effectively transmitted therethrough.

In an embodiment, the wiring portion 1172 shown in FIG. 5 includes an entirely opaque conductor like the source electrode 70 and the drain electrode 71. In an embodiment, the wiring portion 1172 may be a single layer or a multilayer including a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the wiring portion 1172 may be a triple layer of which an upper layer includes titanium (Ti), an intermediate layer includes aluminum (Al), and a lower layer includes titanium (Ti).

In such an embodiment, the wiring portion 1172 of the data conductor disposed in the second display area DA2 in the display device may be a triple layer of which an upper layer includes ITO, an intermediate layer includes silver (Ag), and a lower layer includes ITO. In such an embodiment, the upper layer and the lower layer of the data conductor disposed in the second display area DA2 include a transparent conductor (e.g., ITO), and the intermediate layer of the data conductor disposed in the second display area DA2 includes silver (Ag), and the data conductor has a thickness of about 200 Å, such that the data conductor may be an entirely transparent conductor. Accordingly, the wiring portion 1172 of FIG. 4 may have increased transmittance for external light from the lower part of the substrate 110 in the second display area DA2.

The source electrode 70 and the drain electrode 71 of the data conductor disposed in the second display area DA2 may be triple layers of which an upper layer includes titanium (Ti), an intermediate layer includes aluminum (Al), and a lower layer includes titanium (Ti) as the data conductor disposed in the first display area DA1. The source electrode 70 and the drain electrode of the data conductor having such a triple layer structure may have an upper layer and a lower layer that are transparent, but may be totally opaque due to the thick thickness of aluminum (Al) of the intermediate layer.

The source electrode 70 and the drain electrode 71 of the data conductor are thicker than the wiring portion 1171 and may include an opaque conductor. In an embodiment, where the source electrode 70 and the drain electrode 71 are triple layers each of which an upper layer includes titanium (Ti), an intermediate layer includes aluminum (Al), and a lower layer includes titanium (Ti), a thickness of the source electrode 70 and the drain electrode 71 may be maintained appropriately or at a predetermined thickness such that the source electrode 70 and the drain electrode 71 may be stably connected to the semiconductor layer 130.

The gate electrode 1155, the source electrode 70 and the drain electrode 71 form or constitute a transistor together with the semiconductor layer 130. The first electrode 1156 and the second electrode 1125 form or constitute a capacitor CP together with the second insulation layer 142 disposed therebetween. The transistor and capacitor of the pixel circuit may be disposed in the second pixel area PA2, not in the transmission areas TA.

A planarization layer 180 is disposed on the third insulation layer 160 and the data conductor. The planarization layer 180 may include an organic material. The planarization layer 180 may be flattened or planarized by removing a step to increase luminous efficiency of a light emitting element to be disposed or formed thereon. The planarization layer 180 may cover the third insulation layer 160 and the data conductor in the second pixel area PA2.

A pixel electrode 191 is disposed on the planarization layer 180. The pixel electrode 191 corresponds to the anode of the light emitting diode. The pixel electrode 191 is electrically connected to the drain electrode 71 of the transistor and thus may receive a voltage.

The pixel electrode 191 shown in FIG. 4 may have a triple layer structure or be formed of a triple layer including a transparent conductor. In such an embodiment, an upper layer of the pixel electrode 191 may include at least one selected from ITO, IZO, IGZO, AZO, GZO and ITZO, an intermediate layer of the pixel electrode 191 may include at least one selected from silver (Ag), aluminum (Al) and copper (Cu) and a lower layer of the pixel electrode 191 may include at least one selected from ITO, IZO, IGZO, AZO, GZO and ITZO. A thickness of the intermediate layer may be about 300 Å or less. In one embodiment, for example, the thickness of the intermediate layer may be about 200 Å such that the external light may be effectively transmitted therethrough. Accordingly, the pixel electrode 191 of FIG. 4 may have increased transmittance for external light from the lower part of the substrate 110 in the second display area DA2.

In an embodiment, the pixel electrode 191 shown in FIG. 5 may have a triple layer structure or be formed of a triple layer including a transparent conductor. In such an embodiment, an upper layer of the pixel electrode 191 may include at least one selected from ITO, IZO, IGZO, AZO, GZO and ITZO, an intermediate layer of the pixel electrode 191 may include silver (Ag), and a lower layer of the pixel electrode 191 may include at least one selected from ITO, IZO, IGZO, AZO, GZO and ITZO. A thickness of the intermediate layer of the pixel electrode 191 disposed in the first display area DA1 may be thicker than that of the pixel electrode 191 disposed in the second display area DA2. Accordingly, the transmittance of light may be lower in the first display area DA1 than in the second display area DA2.

In an embodiment of the display device, the pixel electrode 191 disposed in the second display area DA2 may be a triple layer of which an upper layer includes ITO, an intermediate layer includes silver (Ag), and a lower layer includes ITO. In such an embodiment, the pixel electrode 191 disposed in the first display area DA1 may also be a triple layer of which an upper layer includes ITO, an intermediate layer includes silver (Ag), and a lower layer includes ITO. In such an embodiment, a thickness of silver (Ag) of the pixel electrode 191 disposed in the second display area DA2 may be thinner than silver (Ag) of the pixel electrode 191 disposed in the first display area DA1. Here, a thickness of the pixel electrode 191 disposed in the second display area DA2 may be about 200 Å.

Hereinafter, a pixel in the second display area of the display device according to an embodiment will be described with reference to FIG. 6 to FIG. 13.

Figure 6:
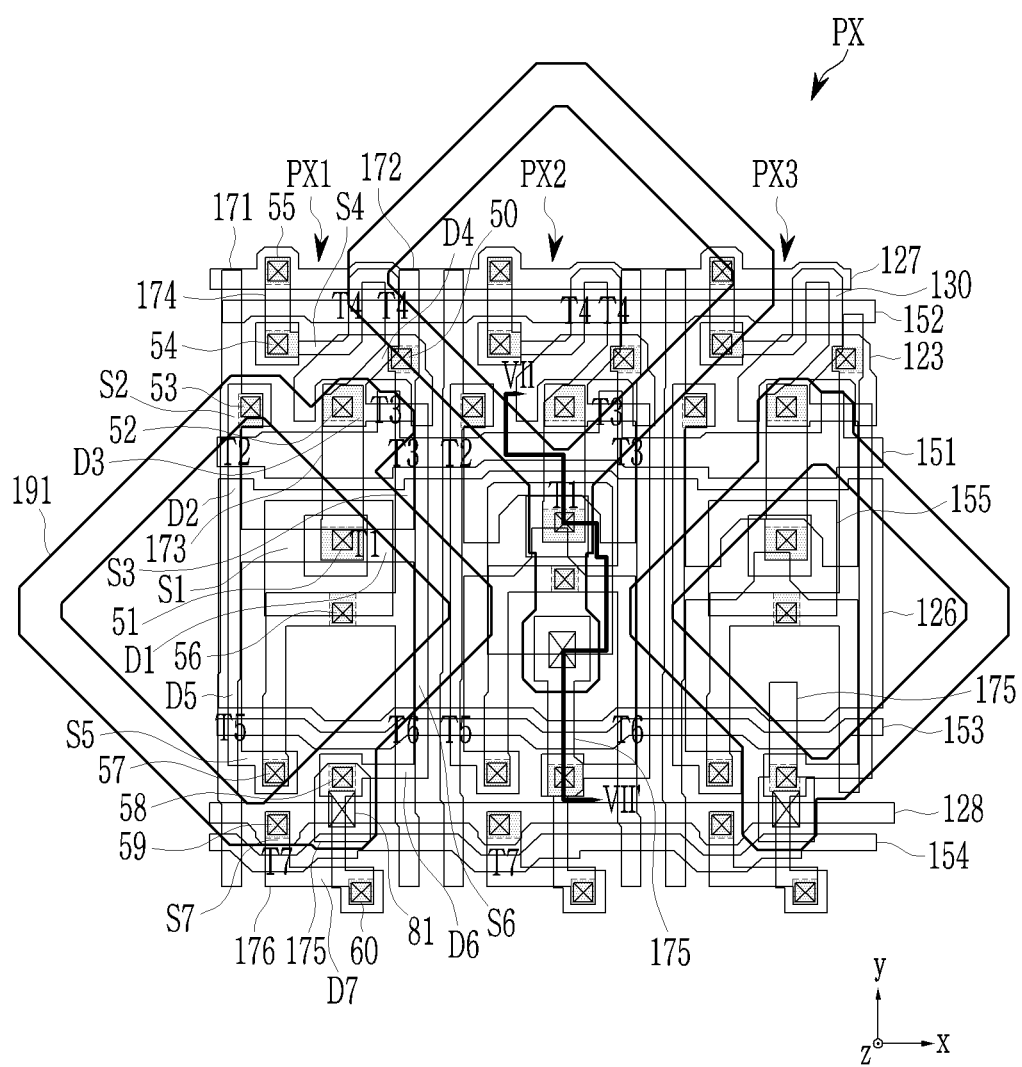
FIG. 6 is a top plan view of a pixel in the second display area of the display device according to an embodiment.
Figure 7:
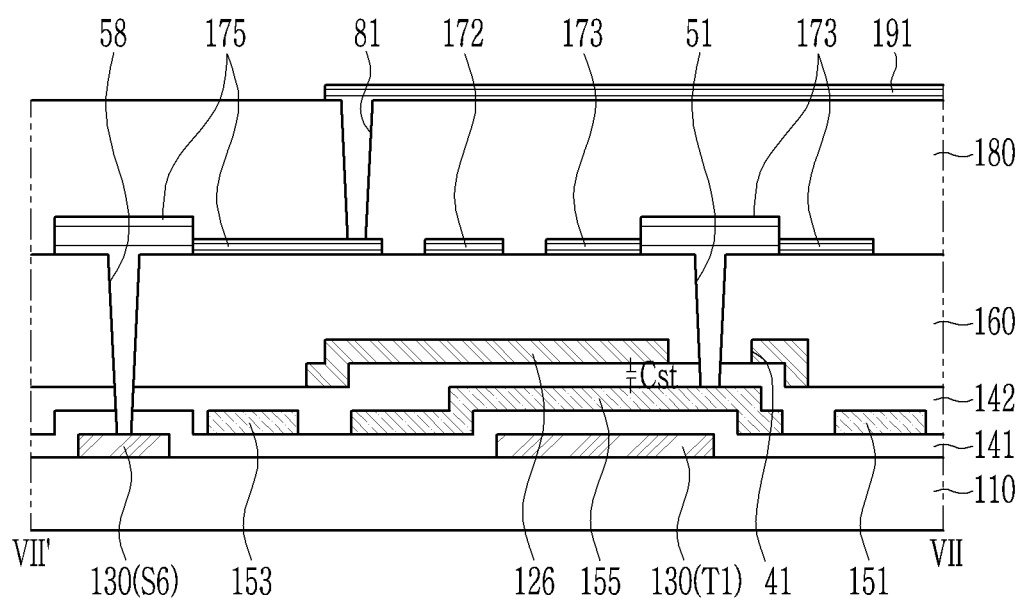
FIG. 7 is a cross-sectional view, taken along line VII-VII' of FIG. 6.
Figure 11:
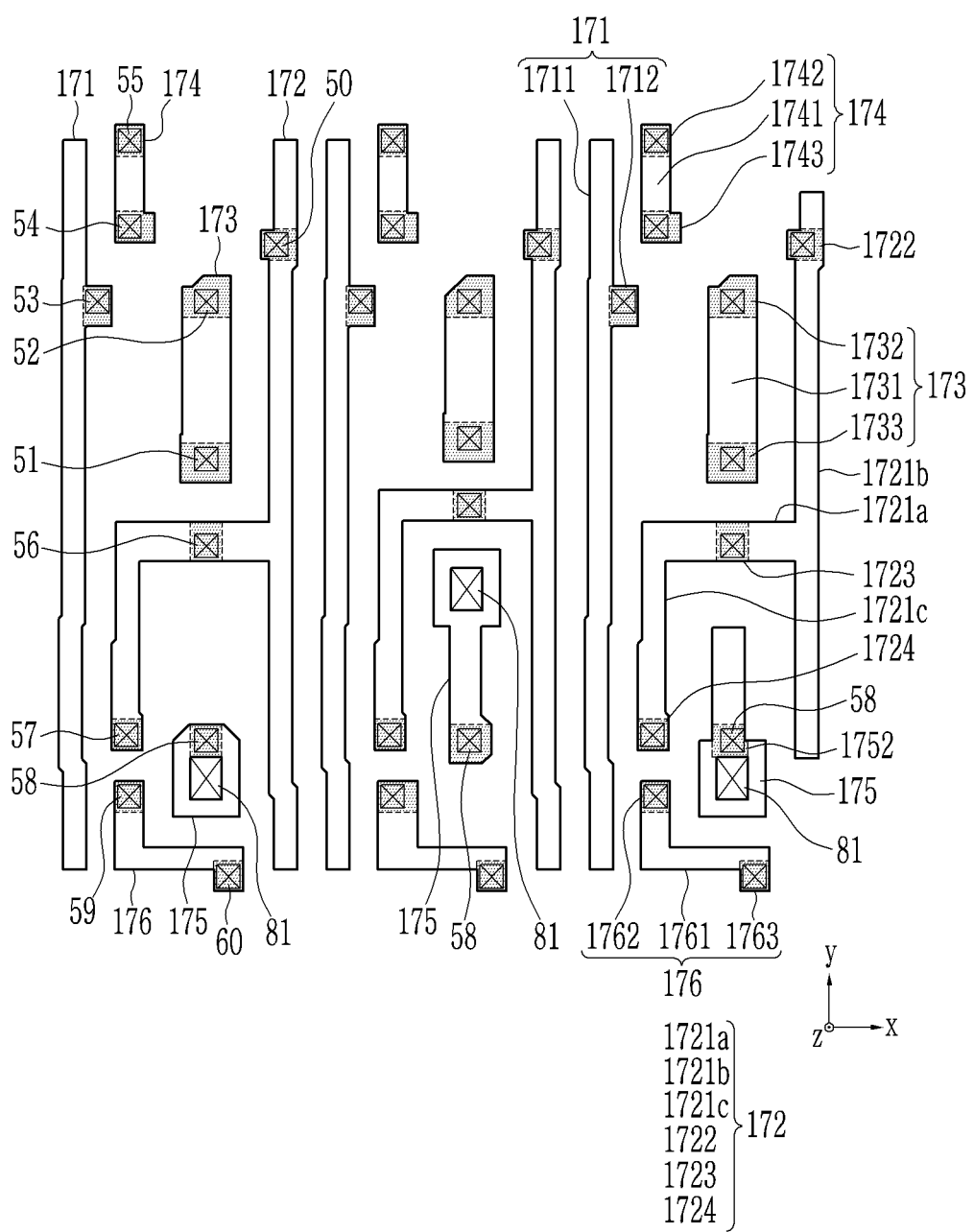
Figure 12:
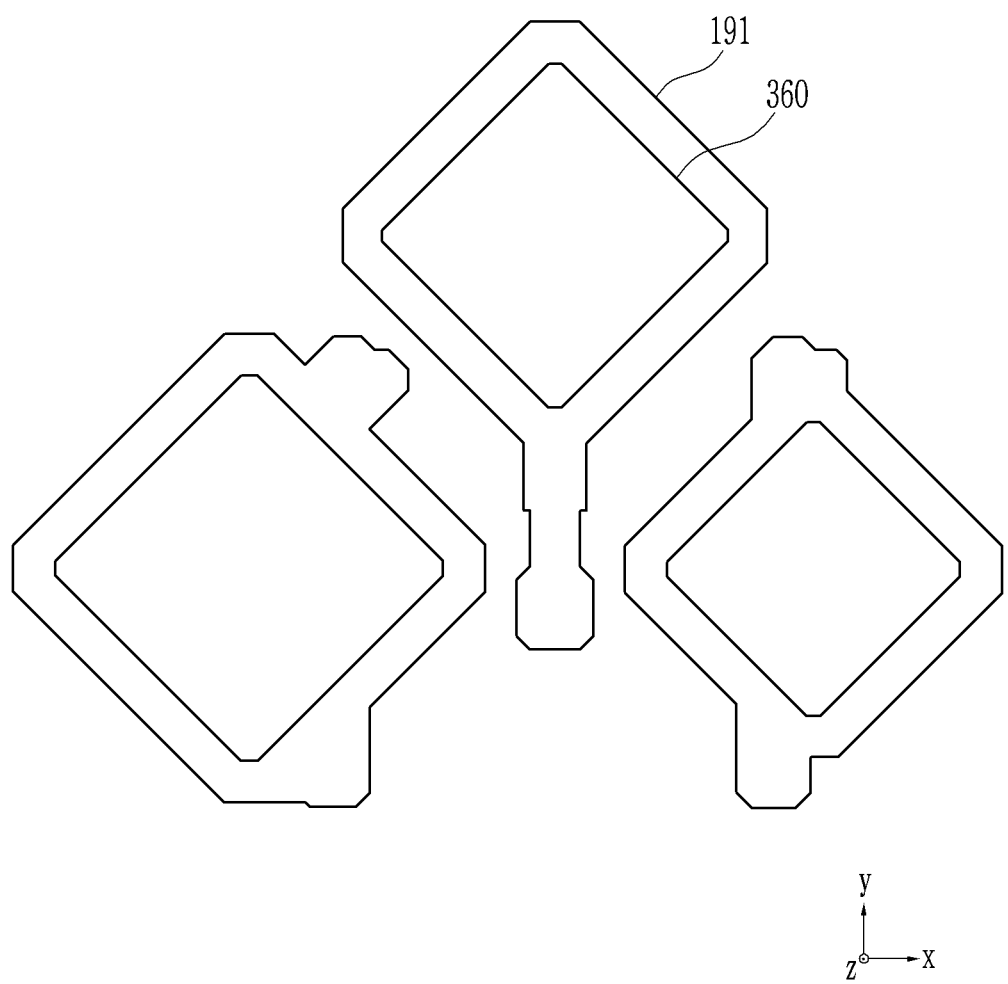
Figure 13:
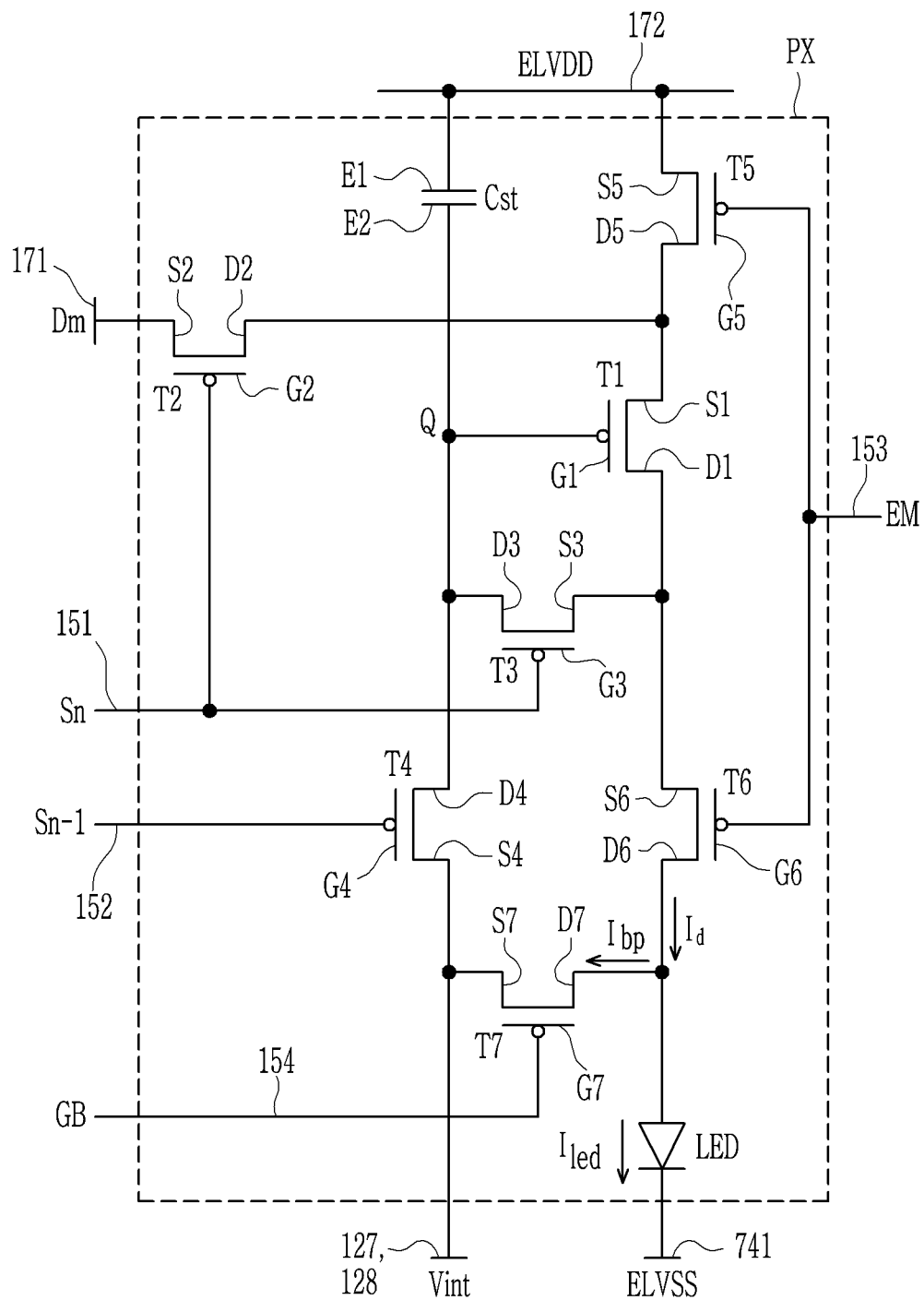
FIG. 13 is a circuit diagram of a pixel of the display device according to an embodiment.

FIG. 6 is a top plan view of a pixel in the second display area of the display device according to an embodiment, FIG. 7 is a cross-sectional view of FIG. 6, taken along line VII-VII', FIG. 8 to FIG. 12 are top plan views illustrating each layer of the pixel of the display device of FIG. 6, and FIG. 13 is a circuit diagram of a pixel of the display device according to an embodiment.

Referring to FIG. 6, an embodiment of a pixel in the second display area DA2 shown in FIG. 6 includes a first subpixel PX1, a second subpixel PX2, and a third subpixel PX3. The first subpixel PX1, the second subpixel PX2, and the third subpixel PX3 each includes same types of electrode, and such same types of electrode may perform a same role, but some electrodes may have different positions and shapes from others. The transmission areas TA may be disposed at the periphery of the pixel PX shown in FIG. 6, and a pixel that is the same as or different from the pixel PX shown in FIG. 6 may be located.

An embodiment of the display device includes a scan line 151, a previous scan line 152, a light emission control line 153, a bypass line 154, and initialization voltage lines 127 and 128 that extend mainly along the first direction x, and respectively transmit a scan signal Sn, a previous scan signal Sn–1, a light emission control signal EM, a bypass signal GB, and an initialization voltage Vint. Although only partially illustrated in FIG. 6, at least one of the scan line 151, the previous scan line 152, the light emission control line 153, the bypass line 154, and the initialization voltage lines 127 and 128 may extend in the first direction x.

The display device includes a data line 171 and a driving voltage line 172 that extend in a second direction y that crosses the first direction x and respectively transmit a data voltage Dm and a driving voltage ELVDD. Although only partially illustrated in FIG. 6, at least one of the data line 171 and the driving voltage line 172 may extend in the second direction y.

In an embodiment, the scan line 151, the previous scan line 152, the light emission control line 153, the bypass line 154, the initialization voltage lines 127 and 128, the data line 171, and the driving voltage line 172 may wholly or partially include a transparent conductor. Accordingly, in such an embodiment, the display device may have increased transmittance for external light, and this will be described in detail later.

In an embodiment, as shown in FIG. 13, the display device includes a driving transistor T1, a second transistor T2, a third transistor T3, a fourth transistor T4, a fifth transistor T5, a sixth transistor T6, a seventh transistor T7, a storage capacitor Cst, and a light emitting diode LED.

Figure 8:
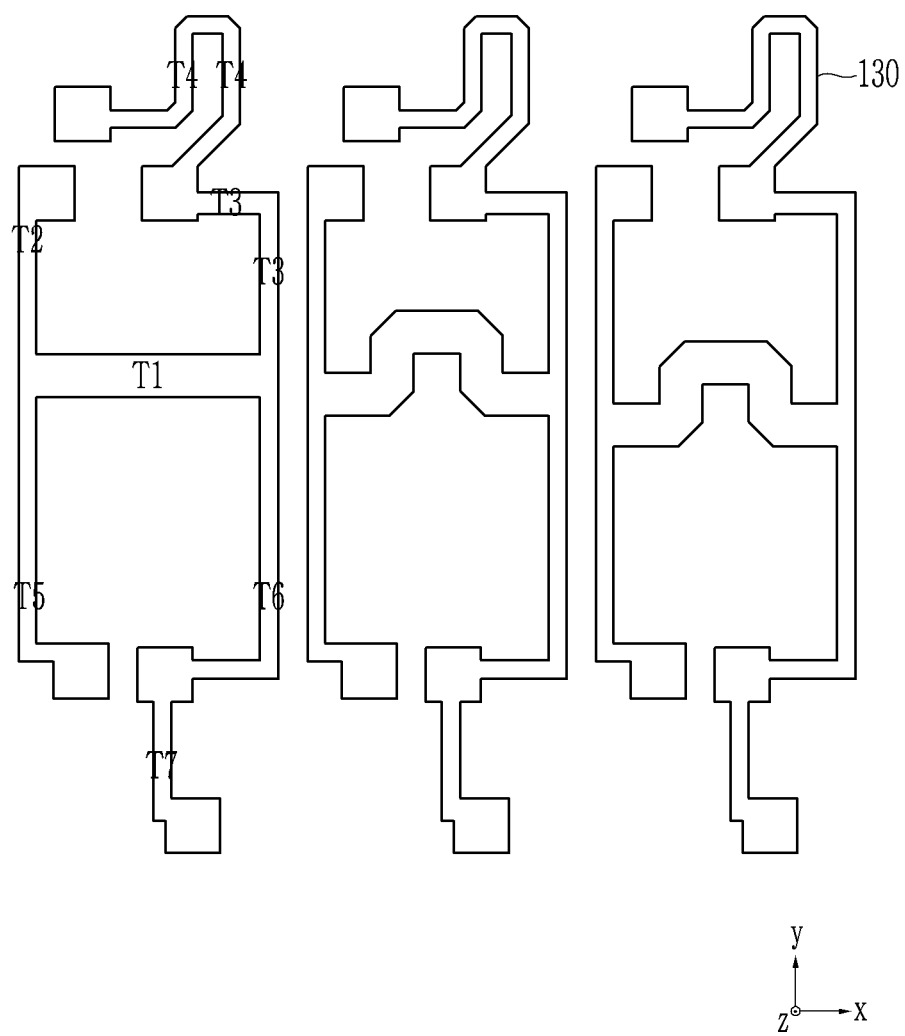
FIG. 8 to FIG. 12 are top plan views illustrating each layer of the pixel of the display device of FIG. 6.

In an embodiment, as shown in FIG. 7, a semiconductor layer 130 of a plurality of transistors T1, T2, T3, T4, T5, T6, and T7 is disposed on the substrate 110 including an insulating material such as a polymer such as polyimide or polyamide, or glass. In FIG. 8, a plan view of the semiconductor layer 130 is illustrated.

In an embodiment, a channel of each of the driving transistor T1, the second transistor T2, the third transistor T3, the fourth transistor T4, the fifth transistor T5, the sixth transistor T6, and the seventh transistor T7 are disposed in or defined by the semiconductor layer 130. In such an embodiment, at least a part of a first electrode and a second electrode of the plurality of transistors T1, T2, T3, T4, T5, T6, and T7 are disposed in the semiconductor layer 130. The semiconductor layer 130 may be formed by bending into various shapes. The semiconductor layer 130 may include a polycrystalline semiconductor such as polysilicon or an oxide semiconductor.

The semiconductor layer 130 includes a channel doped with an N-type impurity or a P-type impurity, and a first doping region and a second doping region that are disposed at opposite sides of the channel and doped with an impurity with higher concentration than the channel. The first doping region and the second doping region respectively correspond to the first electrode and the second electrode of the plurality of transistors T1, T2, T3, T4, T5, T6, and T7. In an embodiment, one of first doping region and the second doping region is a source region, the other of first doping region and the second doping region may be a drain region. In an embodiment, in the semiconductor layer 130, a region between the first electrode and the second electrode of different transistors is also doped so that the two transistors may be electrically connected to each other.

The channel of each of the plurality of transistors T1, T2, T3, T4, T5, T6, and T7 overlaps a gate electrode of each of the transistors T1, T2, T3, T4, T5, T6, and T7, and is disposed between a first electrode and a second electrode of each of the transistors T1, T2, T3, T4, T5, T6, and T7. The plurality of transistors T1, T2, T3, T4, T5, T6, and T7 may have substantially a same lamination structure as each other. Hereinafter, the driving transistor T1 will be mainly described in detail, and any repetitive detailed description of other transistors T2, T3, T4, T5, T6, and T7 will be omitted or simplified.

The driving transistor T1 includes a channel, a first gate electrode 155, a first electrode S1, and a second electrode D1. The first electrode S1 and the second electrode D1 of the driving transistor T1 are respectively disposed at opposite sides of the channel. The channel may be curved to increase a length of the channel within a limited area. The shape of the channel is not limited to the illustrated shape, i.e., a horseshoe like shape "0", and may be variously modified in a U-like shape, an S-like shape, or the like.

A first insulation layer 141 is disposed on the substrate 110 and the semiconductor layer 130.

Figure 9:
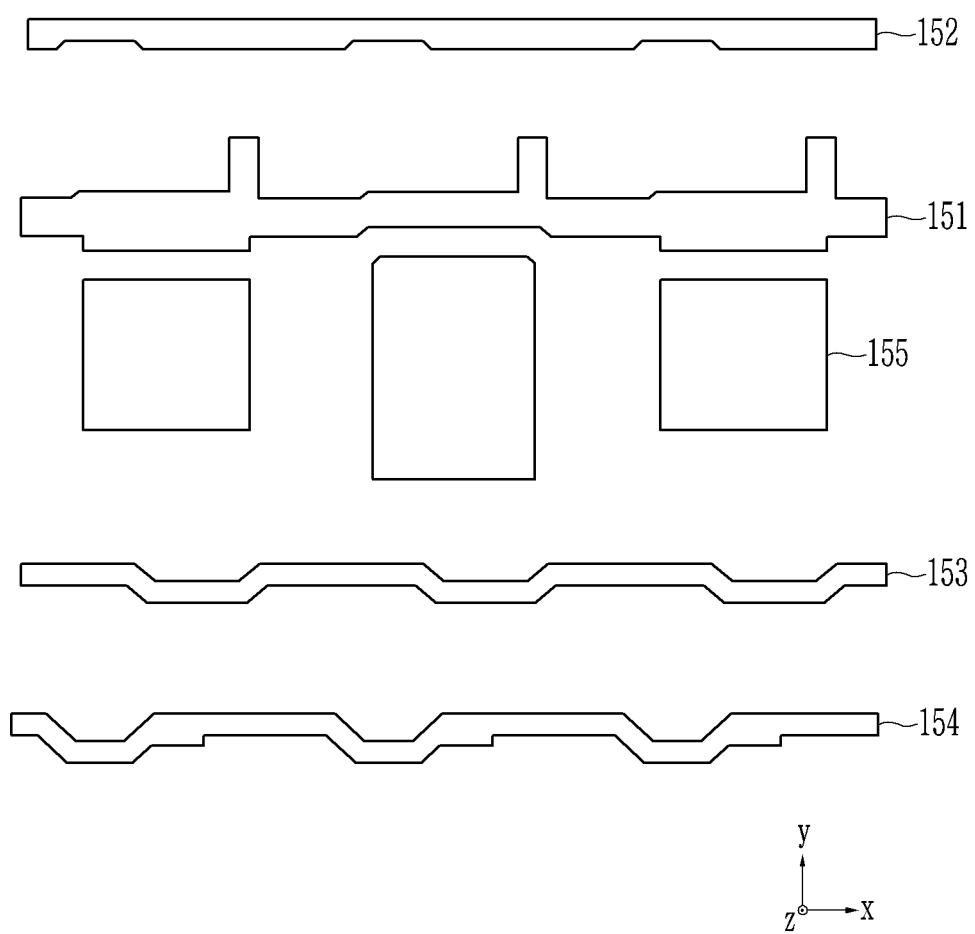

A first gate conductor including gate electrodes of the plurality of transistors, a scan line 151, a previous scan line 152, a light emission control line 153, and a bypass line 154 is disposed on the first insulation layer 141. FIG. 9 illustrates a plan view of the first gate conductor.

The first gate electrode 155 of the driving transistor T1 overlaps the channel on a plane or when view from a thickness direction of the substrate 110.

The gate electrode of the second transistor T2 may be defined by a part of a portion of the scan line 151 that overlaps the semiconductor layer 130.

The gate electrode of the third transistor T3 may be defined by a part of the scan line 151, and may be formed of or defined by two adjacent transistors. In the pixel PX of FIG. 6, the transistor T3 is illustrated on the left and the bottom with reference to a portion where the semiconductor layer 130 of the third transistor T3 is bent. The two portions may be a gate electrode of the third transistor T3.

The gate electrode of the fourth transistor T4 may be a part of the previous scan line 152, and may be formed of or defined by two adjacent transistors. In the pixel PX of FIG. 6, two transistors T4 are illustrated on the bottom with reference to a portion where the semiconductor layer 130 of the fourth transistor T4 is bent. The two portions may respectively be the gate electrode of the fourth transistor T4. Such a structure may be referred to as a dual gate structure, and may block flowing of a leakage current.

The gate electrode of the fifth transistor T5 may be defined by a part of a portion of the light emission control line 153 that overlaps the semiconductor layer 130.

The gate electrode of the sixth transistor T6 may be defined by a part of a portion of the light emission control line 153 that overlaps the semiconductor layer 130.

The gate electrode of the seventh transistor T7 may be defined by a part of a portion of the bypass line 154 that overlaps the semiconductor layer 130.

A second insulation layer 142 is disposed on the first gate conductor.

Figure 10:
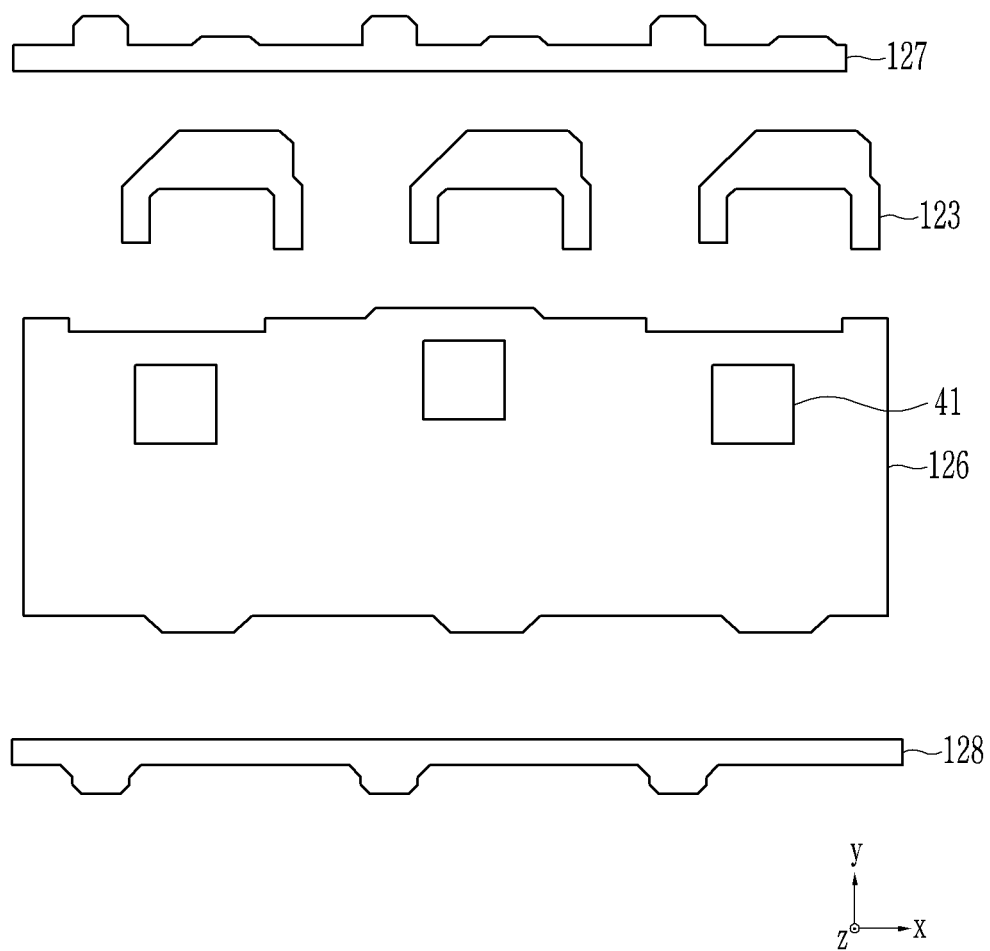

A second gate conductor that includes a sustain electrode 126, initialization voltage lines 127 and 128, and an electrode island 123 is disposed on the second insulation layer 142. In FIG. 10, a plan view of the second gate conductor is illustrated.

The sustain electrode 126 overlaps the first gate electrode 155, and the sustain electrode 126 and the first gate electrode 155 may be connected with each other and extend to be located in the first subpixel PX1, the second subpixel PX2, and the third subpixel PX3. An opening 41 is defined through the sustain electrode 126. The sustain electrode 126 overlaps the first gate electrode 155 while disposing the second insulation layer 142 therebetween on a plane and thus a storage capacitor Cst is formed. The sustain electrode 126 defines a first electrode of the storage capacitor Cst, and the first gate electrode 155 defines a second electrode of the storage capacitor Cst.

The sustain electrode 126 is electrically connected with the driving voltage line 172 through an opening 56. Accordingly, the storage capacitor Cst may store charges that correspond to a difference between a driving voltage ELVDD transmitted to the sustain electrode 126 through the driving voltage line 172 and a gate voltage of the first gate electrode 155.

The initialization voltage lines 127 and 128 may transmit an initialization voltage to the fourth transistor T4 and the seventh transistor T7. The initialization voltage lines 127 and 128 may include a first initialization voltage line 127 that transmits the initialization voltage Vint to the first electrode S4 of the fourth transistor T4, and a second initialization voltage line 128 that transmits the initialization voltage to a second electrode D2 of the seventh transistor T7. The first initialization voltage line 127 and the second initialization voltage line 128 may be respectively applied with different initialization voltages Vint from each other or a same initialization voltage Vint as each other. In an embodiment, the first initialization voltage line 127 and the second initialization voltage line 128 extend in the first direction x and thus may be connected to each other.

The electrode island 123 is positioned in an island shape separated from the sustain electrode 126 and the initialization voltage lines 127 and 128. The electrode island 123 is electrically connected with the driving voltage line 172 through an opening 50. Accordingly, the electrode island 123 may receive the driving voltage ELVDD from the driving voltage line 172.

A third insulation layer 160 is disposed to cover the second insulation layer 142 and second gate conductor on the second insulation layer 142. The third insulation layer 160 may include an organic insulating material.

A data conductor including a first electrode connection portion and a second electrode connection portion of the plurality of transistors, a data line 171, a driving voltage line 172, a first connection electrode 173, a second connection electrode 174, a third connection electrode 176, and an anode connection electrode 175 is disposed on the third insulation layer 160. FIG. 11 illustrates a plan view of the data conductor.

The data line 171 includes a wiring portion 1711 extending in the second direction y and a second transistor connection portion 1712. The wiring portion 1711 of the data line 171 is defined by a portion excluding the second transistor connection portion 1712 connected to a first electrode S2 of the second transistor T2. The second transistor connection portion 1712 is electrically connected with the first electrode S2 of the second transistor T2 through an opening 53.

The wiring portion 1711 of the data line 171 and the second transistor connection portion 1712 may directly contact each other, and may transmit a data voltage Dm by being directly connected to each other. The wiring portion 1711 and the second transistor connection portion 1712 may include different materials from each other.

The wiring portion 1711 of the data line 171 may have a triple layer structure or be formed of a triple layer including a transparent conductor. An upper layer of the wiring portion 1711 may include at least one selected from ITO, IZO, IGZO, AZO, GZO and ITZO, an intermediate layer of the wiring portion 1711 may include at least one selected from silver (Ag), aluminum (Al) and copper (Cu), and a lower layer of the wiring portion 1711 may include at least one selected from ITO, IZO, IGZO, AZO, GZO and ITZO. A thickness of the intermediate layer may be about 300 Å or less. In one embodiment, for example, the thickness of the intermediate layer may be about 200 Å such that the external light may be effectively transmitted therethrough.

In an embodiment, the second transistor connection portion 1712 includes an opaque conductor. In such an embodiment, the second transistor connection portion 1712 may be a single layer or a multilayer including a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the second transistor connection portion 1712 may be a triple layer of which an upper layer includes titanium (Ti), an intermediate layer includes aluminum (Al), and a lower layer includes titanium (Ti). The second transistor connection portion 1712 having such a triple layer structure may have upper and lower transparent layers, but may be totally opaque due to the thick thickness of aluminum (Al) of the intermediate layer.

In an embodiment of the display device, the wiring portion 1711 of the data line 171 disposed in the second display area DA2 may be a triple layer of which an upper layer of include an ITO, an intermediate layer includes silver (Ag), and a lower includes an ITO. In such an embodiment, the upper layer and the lower layer of the wiring portion 1711 of the data line 171 include a transparent conductor (e.g., ITO), and the intermediate layer of the wiring portion 1711 of the data line 171 including silver (Ag) of a thickness of about 200 Å and accordingly, the wiring portion 1711 may be an entirely transparent conductor. Accordingly, the wiring portion 1711 of the data line 171 may have increased transmittance for external light from the lower portion of the substrate 110 in the second display area DA2.

As the data line disposed in the first display area DA1, the second transistor connection portion 1712 disposed in the second display area DA2 may be a triple layer of which an upper layer includes or is formed of titanium (Ti), an intermediate layer includes or is formed of aluminum (Al), and a lower layer includes or is formed of titanium (Ti).

The driving voltage line 172 includes a wiring portion 1721, an electrode island connection portion 1722, a sustain electrode connection portion 1723, and a fifth transistor connection portion 1724.

The wiring portion 1721 of the driving voltage line 172 is defined by a portion excluding the electrode island connection portion 1722, the sustain electrode connection portion 1723, and the fifth transistor connection portion 1724 in the driving voltage line 172. The wiring portion 1721 includes a horizontal wiring portion 1721a extending in the first direction x and a vertical wiring portion extending in the second direction y.

The horizontal wiring portion 1721a and the sustain electrode connection portion 1723 may directly contact each other, and may be directly connected to each other and thus may transmit the driving voltage ELVDD. The sustain electrode connection portion 1723 is electrically connected with the sustain electrode 126 through the opening 56.

The vertical wiring portion includes a first vertical wiring portion 1721b and a second vertical wiring portion 1721c. The first vertical wiring portion 1721b may contact the electrode island connection portion 1722, and may be electrically connected to the electrode island connection portion 1722. The second vertical wiring portion 1721c may directly contact the fifth transistor connection portion 1724, and may be directly connected to the fifth transistor connection portion 1724. The electrode island connection portion 1722 is electrically connected to the electrode island 123 through the opening 50. The fifth transistor connection portion 1724 is electrically connected with a first electrode S5 of the fifth transistor T5 through an opening 57.

The wiring portion 1721 of the driving voltage line 172 may have a triple layer structure or be formed of a triple layer including a transparent conductor. An upper layer may include at least one selected from ITO, IZO, IGZO, AZO, GZO and ITZO, an intermediate layer may include at least one selected from silver (Ag), aluminum (Al) and copper (Cu), and a lower layer may include at least one selected from ITO, IZO, IGZO, AZO, GZO and ITZO. A thickness of the intermediate layer may be about 300 Å or less. In one embodiment, for example, the thickness of the intermediate layer may be about 200 Å such that the external light may be effectively transmitted therethrough.

In an embodiment, the electrode island connection portion 1722, the sustain electrode connection portion 1723, and the fifth transistor connection portion 1724 include opaque conductors. In such an embodiment, the electrode island connection portion 1722, the sustain electrode connection portion 1723, and the fifth transistor connection portion 1724 may be a single layer or a multilayer including a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the electrode island connection portion 1722, the sustain electrode connection portion 1723, and the fifth transistor connection portion 1724 may be triple layers of which an upper layer includes or is formed of titanium (Ti), an intermediate layer includes or is formed of aluminum (Al), and a lower layer includes or is formed of titanium (Ti).

In an embodiment of the display device, the wiring portion 1721 of the driving voltage line 172 disposed in the second display area DA2 may be a triple layer of which an upper layer include an ITO, an intermediate layer includes silver (Ag), and a lower includes an ITO. The wiring portion 1721 of the driving voltage line 172 may be an entirely transparent conductor because the upper layer and the lower layer include a transparent conductor (e.g., ITO), and the intermediate layer has silver (Ag) at a thickness of about 200 Å. Accordingly, the wiring portion 1721 of the driving voltage line 172 may have increased transmittance for external light from the lower portion of the substrate 110 in the second display area DA2.

As the driving voltage line disposed in the first display area DA1, the electrode island connection portion 1722, the sustain electrode connection portion 1723, and the fifth transistor connection portion 1724 disposed in the second display area DA2 may each be a triple layer of which an upper layer includes or is formed of titanium (Ti), an intermediate layer includes or is formed of aluminum (Al), and a lower layer includes or is formed of titanium (Ti). The electrode island connection portion 1722, the sustain electrode connection portion 1723, and the fifth transistor connection portion 1724 having such a triple layer structure may be entirely opaque due to a thick thickness of aluminum (Al) of the intermediate layer even through the upper layer and the lower layer may be transparent.

A connection portion excluding the data line and the wiring portion of the driving voltage line 172 shown in FIG. 11 is indicated by dotted lines, but the area of the connection may be variously changed depending on the shape and size of each opening.

The first connection electrode 173 includes a wiring portion 1731, a first gate electrode connection portion 1732, and a third transistor connection portion 1733. The wiring portion 1731 of the first connection electrode 173 is defined by a portion excluding the first gate electrode connection portion 1732 and the third transistor connection portion 1733. The wiring portion 1731 may directly contact the first gate electrode connection portion 1732 and the third transistor connection portion 1733, and may be electrically connected to the first gate electrode connection portion 1732 and the third transistor connection portion 1733.

The first gate electrode connection portion 1732 is electrically connected to the first gate electrode 155 through an opening 51, and the third transistor connection portion 1733 is electrically connected to the second electrode D3 of the third transistor T3 through an opening 52. Accordingly, the first connection electrode 173 may connect the gate electrode 155 of the driving transistor T1 and the second electrode D3 of the third transistor T3.

The first gate electrode connection portion 1732 and the third transistor connection portion 1733 include an opaque conductor. In an embodiment, the first gate electrode connection portion 1732 and the third transistor connection portion 1733 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the first gate electrode connection portion 1732 and the third transistor connection portion 1733 may be triple layers in each of which an upper layer includes or is formed of titanium (Ti), an intermediate layer includes or is formed of aluminum (Al), and a lower layer includes or is formed of titanium (Ti).

In an embodiment, the wiring portion 1731 of the first connection electrode 173 may have a triple layer structure or be formed of a triple layer including a transparent conductor. An upper layer of the wiring portion 1731 may include at least one selected from ITO, IZO, IGZO, AZO, GZO and ITZO, an intermediate layer of the wiring portion 1731 may include silver (Ag), aluminum (Al), copper (Cu), and the like, and a lower layer of the wiring portion 1731 may include at least one selected from ITO, IZO, IGZO, AZO, GZO and ITZO. A thickness of the intermediate layer of the wiring portion 1731 may be about 300 Å or less. In one embodiment, for example, the thickness of the intermediate layer may be about 200 Å such that the external light may be effectively transmitted therethrough. Accordingly, the wiring portion 1731 of the first connection electrode 173 may increase transmittance of external light flowing from the lower portion of the substrate 110.

The second connection electrode 174 includes a wiring portion 1741, a fourth transistor connection portion 1742, and a first initialization connection portion 1743. The wiring portion 1741 of the second connection electrode 174 is defined by a portion excluding the fourth transistor connection portion 1742 and the first initialization connection portion 1743. The wiring portion 1741 may directly contact the fourth transistor connection portion 1742 and the first initialization connection portion 1743, and may be electrically connected to the fourth transistor connection portion 1742 and the first initialization connection portion 1743.

The fourth transistor connection portion 1742 is connected to the first electrode S4 of the fourth transistor T4 through an opening 54, and the first initialization connection portion 1743 is connected to the through an opening 55. Accordingly, the second connection electrode 174 may connect the fourth transistor T4 and the first initialization voltage line 127.

The fourth transistor connection portion 1742 and the first initialization connection portion 1743 include an opaque conductor. In an embodiment, the fourth transistor connection portion 1742 and the first initialization connection portion 1743 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the fourth transistor connection portion 1742 and the first initialization connection portion 1743 may be triple layers in each of which an upper layer includes or is formed of titanium (Ti), an intermediate layer includes or is formed of aluminum (Al), and a lower layer includes or is formed of titanium (Ti).

In an embodiment, the wiring portion 1741 of the second connection electrode 174 may have a triple layer structure or be formed of a triple layer including a transparent conductor. An upper layer of the wiring portion 1741 may include at least one selected from ITO, IZO, IGZO, AZO, GZO and ITZO, an intermediate layer of the wiring portion 1741 may include silver (Ag), aluminum (Al), copper (Cu), and the like, and a lower layer of the wiring portion 1741 may include at least one selected from ITO, IZO, IGZO, AZO, GZO and ITZOITO. A thickness of the intermediate layer of the wiring portion 1741 may be about 300 Å or less. In one embodiment, for example, the thickness of the intermediate layer may be about 200 Å such that the external light may be effectively transmitted therethrough. Accordingly, the wiring portion 1741 of the second connection electrode 174 may increase transmittance of external light flowing from the lower portion of the substrate 110.

The third connection electrode 176 includes a wiring portion 1761, a second initialization connection portion 1762, and a seventh transistor connection portion 1763. The wiring portion 1761 of the third connection electrode 176 is defined by a portion excluding the second initialization connection portion 1762 and the seventh transistor connection portion 1763. The wiring portion 1761 may directly contact the second initialization connection portion 1762 and the seventh transistor connection portion 1763, or may be electrically connected to the second initialization connection portion 1762 and the seventh transistor connection portion 1763.

The second initialization connection portion 1762 is connected to the second initialization voltage line 128 through an opening 59, and the seventh transistor connection portion 1763 is connected to a second electrode D7 of the seventh transistor T7 through an opening 60. Accordingly, the third connection electrode 176 may connect the seventh transistor T7 and the second initialization voltage line 128.

The second initialization connection portion 1762 and the seventh transistor connection portion 1763 include an opaque conductor. In an embodiment, the second initialization connection portion 1762 and the seventh transistor connection portion 1763 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the second initialization connection portion 1762 and seventh transistor connection portion 1763 may be triple layers in each of which an upper layer includes or is formed of titanium (Ti), an intermediate layer includes or is formed of aluminum (Al), and a lower layer includes or is formed of titanium (Ti).

In an embodiment, the wiring portion 1761 of the third connection electrode 176 may have a triple layer structure or be formed of a triple layer including a transparent conductor. An upper layer of the wiring portion 1761 may include at least one selected from ITO, IZO, IGZO, AZO, GZO and ITZOITO, an intermediate layer of the wiring portion 1761 may include at least one selected from silver (Ag), aluminum (Al) and copper (Cu), and a lower layer of the wiring portion 1761 may include at least one selected from ITO, IZO, IGZO, AZO, GZO and ITZOITO. A thickness of the intermediate layer of the wiring portion 1761 may be about 300 Å or less. In one embodiment, for example, the thickness of the intermediate layer may be about 200 Å such that the external light may be effectively transmitted therethrough. Accordingly, the wiring portion 1761 of the third connection electrode 176 may have increased transmittance for external light from the lower portion of the substrate 110.

The anode connection electrode 175 includes a sixth transistor connection portion 1752. The sixth transistor connection portion 1752 may be connected to a second electrode D6 of the sixth transistor T6 through an opening 58. In such an embodiment, the anode connection electrode 175 may be connected to the pixel electrode 191 through an opening 81. The opening 81 connected to the pixel electrode 191 in the anode connection electrode 175 may or may not overlap the sixth transistor connection portion 1752.

The anode connection electrode 175 may be implemented in different shapes in each of the subpixel PX1, PX2, and PX3. In an embodiment, as shown in FIG. 6, the anode connection electrode 175 may be implemented as an island shape in the first subpixel PX1, may be implemented as a long bar extending downward from the opening 81 such than the opening 58 is disposed therein in the second subpixel PX2, and may be implemented in a long bar extended upward from the opening 58, while the opening 81 and the opening 58 are disposed adjacent to each other in the third subpixel PX3.

The sixth transistor connection portion 1752 surrounding the opening 58 includes an opaque conductor. In an embodiment, the sixth transistor connection portion 1752 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like. In one embodiment, for example, the sixth transistor connection portion 1752 may be a triple layer of which an upper layer includes or is formed of titanium (Ti), an intermediate layer includes or is formed of aluminum (Al), and a lower layer includes or is formed of titanium (Ti).

In an embodiment, a bar-shaped portion in the anode connection electrode 175, excluding the sixth transistor connection portion 1752, may have a triple layer structure or be formed of a triple layer including a transparent conductor. An upper layer of the bar-shaped portion in the anode connection electrode 175 may include at least one selected from ITO, IZO, IGZO, AZO, GZO and ITZOITO, an intermediate layer of the bar-shaped portion in the anode connection electrode 175 may include at least one selected from silver (Ag), aluminum (Al) and copper (Cu), and a lower layer of the bar-shaped portion in the anode connection electrode 175 may include at least one selected from ITO, IZO, IGZO, AZO, GZO and ITZOITO. A thickness of the intermediate layer of the bar-shaped portion in the anode connection electrode 175 may be about 300 Å or less. In one embodiment, for example, the thickness of the intermediate layer may be about 200 Å such that the external light may be effectively transmitted therethrough Accordingly, the anode connection electrode 175 may increase transmittance of external light flowing from the lower portion of the substrate 110.

In an embodiment of the display device, the wiring portions of the respective connection electrodes 173, 174, 175, and 176 disposed in the second display area DA2 may be triple layers in each of which an upper layer includes titanium (Ti), an intermediate layer includes aluminum (Al), and a lower layer includes titanium (Ti). In the wiring portion of each of the connection electrodes 173, 174, 175, and 176, the upper layer and the lower layer include a transparent conductor (e.g., ITO) and the intermediate layer includes silver (Ag) with a thickness of about 300 Å or less, and thus the wiring portion of each of the connection electrodes 173, 174, 175, and 176 may be an entirely transparent conductor.

Each of the connection portions disposed in the second display area DA2 may be a triple layer of which an upper layer includes titanium (Ti), an intermediate layer includes aluminum (Al), and a lower layer includes titanium (Ti).

A planarization layer 180 is disposed on the data conductor.

The pixel electrode 191 is disposed on the planarization layer 180. FIG. 12 illustrates a plan view of the pixel electrode 191.

The pixel electrode 191 may have an approximate rhombus shape. In an embodiment, the pixel electrode 191 in the subpixels PX1, PX2, and PX3 may be implemented with different shapes based on a position of an opening 81 connected with the sixth transistor T6. In an embodiment, the opening 81 in the first subpixel PX1 is positioned on one side of the lower vertex of the rhombus and thus it may be a polygon that is partially expanded from the lower vertex. In such an embodiment, the opening 81 in the second subpixel PX2 may be a polygon including an elongated rectangular shape extending in the second direction y from the lower vertex by being spaced apart from the lower vertex of the rhombus. In such an embodiment, the opening 81 in the third subpixel PX3 may be a polygon including a quadrangle that is positioned adjacent to the lower vertex of the rhombus and partially extends in the second direction y from the lower vertex.

The pixel electrode 191 may be electrically connected with the anode connection electrode 175 through the opening 81 of the planarization layer 180. Accordingly, the pixel electrode 191 may be connected with the sixth transistor T6 through the anode connection electrode 175, and may receive an output current of the driving transistor T1.

The pixel electrode 191 may have a triple layer structure or be formed of a triple layers including a transparent conductor as a whole. An upper layer of the pixel electrode 191 may include at least one selected from ITO, IZO, IGZO, AZO, GZO and ITZOITO, an intermediate layer of the pixel electrode 191 may include at least one selected from silver (Ag), aluminum (Al) and copper (Cu), and a lower layer of the pixel electrode 191 may include at least one selected from ITO, IZO, IGZO, AZO, GZO and ITZOITO. A thickness of the intermediate layer of the pixel electrode 191 may be about 300 Å or less. In one embodiment, for example, the thickness of the intermediate layer may be about 200 Å such that the external light may be effectively transmitted therethrough. Accordingly, the pixel electrode 191 may have increased transmittance for external light from the lower portion of the substrate 110.

In an embodiment of the display device, a pixel electrode 191 disposed in the second display area DA2 may be a triple layer of which an upper layer includes ITO, an intermediate layer includes silver (Ag), and a lower layer includes ITO. A pixel electrode 191 disposed in the first display area DA1 may also be a triple layer of which an upper layer includes ITO, an intermediate layer includes silver (Ag), and a lower layer includes ITO. In such an embodiment, a thickness of silver (Ag) of the pixel electrode 191 disposed in the second display area DA2 may be thinner than a thickness of silver (Ag) of the pixel electrode 191 disposed in the first display area DA1. In one embodiment, for example, the thickness of the pixel electrode 191 disposed in the second display area DA2 may be about 200 Å.

In embodiments, the pixel electrode 191 may include an opaque portion. The opaque pixel electrode 191 may be a triple layer of which an upper layer includes ITO, an intermediate layer includes silver (Ag), and a lower layer includes ITO. A thickness of the intermediate layer of the pixel electrode 191 of the second display area DA2 may be the same as the thickness of the intermediate layer of the pixel electrode 191 disposed in the first display area DA1 shown in FIG. 5. In such an embodiment where the thickness of the pixel electrode 191 in the second display area DA2 is the same as the thickness of the pixel electrode 191 in the first display area DA1, the pixel electrode 191 may be connected with the transparent anode connection electrode 175 and a second electrode D6 of the transparent sixth transistor T6 through the opening 81 of the planarization layer 180, and thus transmittance of external light from the lower portion of the substrate 110 may be increased.

A partitioning wall (not shown) may be disposed on the pixel electrode 191. An opening is defined or formed in the partitioning wall to overlap the pixel electrode 191. An emission layer may be positioned at the opening in the partitioning wall. A rhombus shape positioned within the pixel electrode 191 shown in FIG. 12 may be an emission layer 360. A common electrode (not shown) may be positioned on the emission layer 360. The pixel electrode 191, the emission layer 360, and the common electrode may form or constitute a light emitting diode LED.

Referring to FIG. 13, a plurality of signal lines 127, 151, 152, 153, 154, 171, 172, and 741 are connected to one pixel PX. The plurality of signal lines include an initialization voltage line 127, a scan line 151, a previous scan line 152, a light emission control line 153, a bypass control line 154, a data line 171, a driving voltage line 172, and a common voltage line 741.

The scan line 151 is connected to a gate driver (not shown) and transmits a scan signal Sn to the second transistor T2 and the third transistor T3. The previous scan line 152 is connected to the gate driver and thus transmits a previous scan signal Sn−1 applied to a pixel PX located in the previous stage to the fourth transistor T4. The light emission control line 153 is connected to a light emission control portion (not shown), and transmits a light emission control signal EM that controls light emission time of the light emitting diode LED to the fifth transistor T5 and the sixth transistor T6. The bypass control line 154 transmits a bypass signal GB to the seventh transistor T7.

The data line 171 is a wire that transmits a data voltage Dm generated from a data driver (not shown), and luminance of light emitted from the light emitting diode LED changes according to the data voltage Dm. The driving voltage line 172 applies a driving voltage ELVDD, the initialization voltage line 127 transmits an initialization voltage Vint that initializes the driving transistor T1, and the common voltage line 741 applies a common voltage LEVDD. The driving voltage line 172, the initialization voltage line 127, and common voltage line 741 may be respectively applied with a constant voltage.

The driving transistor T1 is a transistor that adjusts intensity of an output current based on the applied data voltage Dm. The first electrode S1 of the driving transistor T1 is connected with the driving voltage line 172 via the fifth transistor T5. The first electrode S1 of the driving transistor T1 is further connected with the second electrode D2 of the second transistor T2, and thus receives the data voltage Dm. The second electrode D1 is connected with an anode of the light emitting diode LED via the sixth transistor T6. Meanwhile, the gate electrode G1 is connected with one electrode (i.e., a second sustain electrode E2) of the storage capacitor Cst. Thus, a voltage of the gate electrode G1 changes based on a voltage stored in the storage capacitor Cst, and accordingly, a driving current Id output from the driving transistor T1 is changed.

The second transistor T2 is a transistor receiving the data voltage Dm in the pixel PX. The gate electrode G2 is connected with the scan line 151, and the first electrode S2 is connected with the data line 171. The second electrode D2 of the second transistor T2 is connected with the first electrode S1 of the driving transistor T1. When the second transistor T2 is turned on in response to the scan signal Sn transmitted through the scan line 151, the data voltage Dm transmitted through the data line 171 is transmitted to the first electrode S1 of the driving transistor T1.

The third transistor T3 is a transistor that allows a compensation voltage (i.e., Dm+Vth, where Vth denotes a threshold voltage) changed from the data voltage Dm through the driving transistor T1 to be transmitted to the second sustain electrode E2 of the storage capacitor Cst. The gate electrode G3 is connected to the scan line 151, and a first electrode S3 is connected to the second electrode D1 of the driving transistor T1. A second electrode D3 of the third transistor T3 is connected with the second sustain electrode E2 of the storage capacitor Cst and the gate electrode G1 of the driving transistor T1. The third transistor T3 is turned on in response to the scan signal Sn transmitted through the scan line 151 and thus connects the gate electrode G1 and the second electrode D1 of the driving transistor T1 to each other, and also connects the second electrode D1 of the driving transistor T1 and the second sustain electrode E2 of the storage capacitor Cst.

The fourth transistor T4 initializes the gate electrode G1 of the driving transistor T1 and the second sustain electrode E1 of the storage capacitor Cst. The gate electrode G4 is connected to the previous scan line 152, and the first electrode S4 is connected to the initialization voltage line 127. A second electrode D4 of the fourth transistor T4 is connected to the second sustain electrode E2 of the storage capacitor Cst and the gate electrode G1 of the driving transistor T1.

The fifth transistor T5 transmits the driving voltage ELVDD to the driving transistor T1. The gate electrode G5 is connected to the light emission control line 153, and the first electrode S5 is connected to the driving voltage line 172. A second electrode D5 of the fifth transistor T5 is connected with the first electrode S1 of the driving transistor T1.

The sixth transistor T6 transmits the driving current Id output from the driving transistor T1 to the light emitting diode LED. The gate electrode G6 is connected to the light emission control line 153, and a first electrode S6 is connected to the second electrode D1 of the driving transistor T1. A second electrode D6 of the sixth transistor T6 is connected to the anode of the light emitting diode LED.

The fifth transistor T5 and the sixth transistor T6 are simultaneously turned on in response to the light emission control signal EM transmitted through the light emission control line 153, and when the driving voltage ELVDD is applied to the first electrode S1 of the driving transistor T1 through the fifth transistor T5, the driving transistor T1 outputs the driving current Id based on a voltage of the gate electrode G1 of the driving transistor T1. The output driving current Id is transmitted to the light emitting diode LED through the sixth transistor T6. As a current Iled flows to the light emitting diode LED, the light emitting diode LED emits light.

The seventh transistor T7 initializes the anode of the light emitting diode LED. The gate electrode G7 is connected to the bypass control line 154, a first electrode S7 is connected to the anode of the light emitting diode LED, and a second electrode D7 is connected to the initialization voltage line 127. When the seventh transistor T7 is turned on in response to the bypass signal GB, the initialization voltage Vint is applied to the anode of the light emitting diode LED and a current path other than the current path of the light emitting diode LED is formed as a bypass current Ibp, such that the anode of the light emitting diode LED is initialized.

The first sustain electrode E1 of the storage capacitor Cst is connected to the driving voltage line 172, and the second sustain electrode E2 is connected to the gate electrode G1 of the driving transistor T1, the second electrode D3 of the third transistor T3, and the second electrode D4 of the fourth transistor T4. Accordingly, the second sustain electrode E2 determines the voltage of the gate electrode G1 of the driving transistor T1, and receives the data voltage Dm through the second electrode D3 of the third transistor T3 or receives the initialization voltage Vint through the second electrode D4 of the fourth transistor T4.

In an embodiment, the anode of the light emitting diode LED is connected to a second electrode D6 of the sixth transistor T6 and a first electrode S7 of the seventh transistor T7, and a cathode is connected to the common voltage line 741 that transmits the common voltage ELVSS.

In an embodiment, as shown in FIG. 13, the pixel circuit includes seven transistors T1 to T7 and a single capacitor Cst, but not being limited thereto. Alternatively, the number of transistors, the number of capacitors, and connections therebetween may be variously modified.

Hereinafter, referring to FIG. 14, improved transmittance in a display device according to an embodiment will be described.

Figure 14:
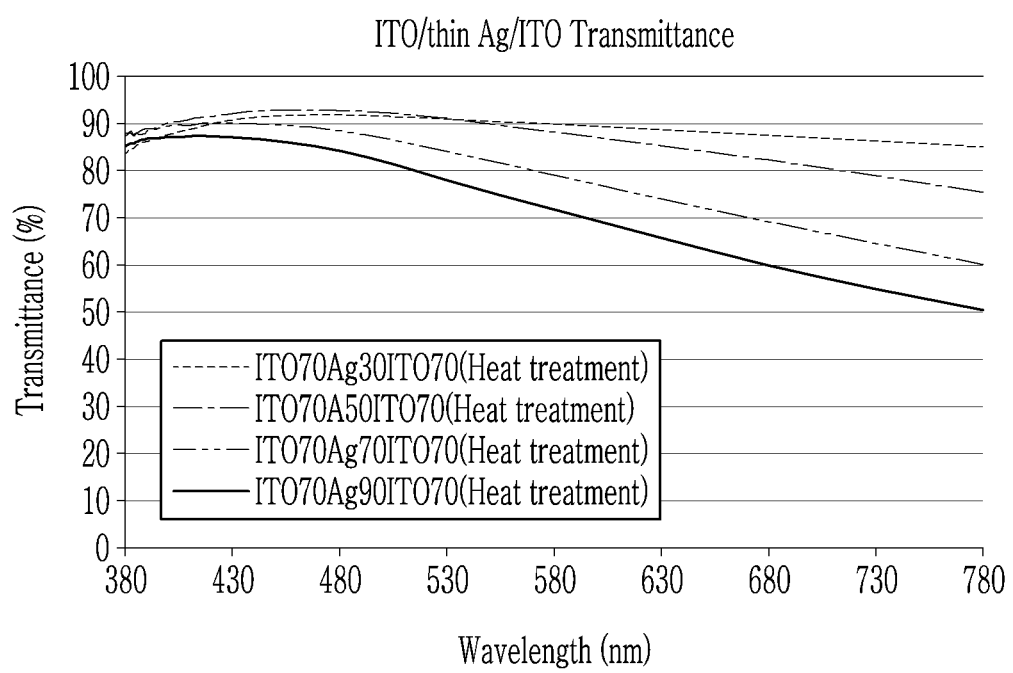
FIG. 14 is a graph showing improved transmittance in a display device according to an embodiment.

FIG. 14 is a graph showing improved transmittance in a display device according to an embodiment.

In FIG. 14, transmittances of a transparent conductor where an upper layer includes or is formed of ITO, an intermediate layer includes or is formed of silver (Ag), a lower layer includes or is formed of ITO, and is heat-treated, according to wavelengths are illustrated. In an embodiment, such a transparent conductor may be substantially the same as the first gate conductor, the second gate conductor, the wiring portion of the data conductor, and the pixel electrode of the embodiments described above.

Table 1 shows transmittance according to wavelengths.

TABLE 1

| Conductor (Å) | Transmittance (380-780 nm) | | | |
| --- | --- | --- | --- | --- |
| | Average | 450 nm (%) | 550 nm (%) | 650 nm (%) |
| ITO70/Ag30/ITO70 (heat treatment) | 88.8 | 91.5 | 90.4 | 88.1 |
| ITO70/Ag50/ITO70 (heat treatment) | 86.5 | 92.6 | 89.9 | 83.9 |
| ITO70/Ag70/ITO70 (heat treatment) | 77.97 | 89.8 | 82.0 | 72.0 |
| ITO70/Ag90/ITO70 (heat treatment) | 71.2 | 86.4 | 75.4 | 63.3 |

Referring to FIG. 14, together with Table 1, in the transparent conductor, the thinner the thickness of silver (Ag) is, the higher the average transmittance and transmittance at each wavelength become. Accordingly, in an embodiment, the first gate conductor, the second gate conductor, the wire portion of the data conductor, and the pixel electrode include a transparent conductor, thereby improving transmittance.

In embodiments of the display device according to the invention including the transparent conductor, a signal delay may be effectively prevented by securing low resistance by including silver (Ag) having a thickness of about 300 Å or less.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate including a first display area and a second display area;
   an optical element which overlaps the second display area;
   a semiconductor layer disposed on the substrate;
   a first insulation layer disposed to cover the semiconductor layer;
   a gate conductor disposed on the first insulation layer;
   a second insulation layer disposed to cover the gate conductor;
   a data conductor disposed on the second insulation layer;
   a third insulation layer disposed to cover the data conductor; and
   a pixel electrode disposed on the data conductor,
   wherein the data conductor disposed in the first display area is an opaque conductor, and
   a part of the data conductor disposed in the second display area is a transparent conductor.

2. The display device of claim 1, wherein
   the data conductor in the second display area comprises a source connection portion, a drain connection portion and a wiring portion, which are connected to the semiconductor layer, and
   the wiring portion is the transparent conductor.

3. The display device of claim 2, wherein
   the transparent conductor has a triple layer structure including an upper layer, an intermediate layer, and a lower layer,
   the upper layer and the lower layer of the transparent conductor comprise at least one selected from indium tin oxide, indium zinc oxide, indium gallium zinc oxide, aluminum zinc oxide, gallium zinc oxide and indium tin zinc oxide, and
   the intermediate layer of the transparent conductor comprises at least one selected from silver (Ag), copper (Cu), and aluminum (Al).

4. The display device of claim 3, wherein a thickness of the intermediate layer of the transparent conductor is about 300 Å or less.

5. The display device of claim 2, wherein each of the source connection portion and the drain connection portion has a triple layer structure in which an upper layer and a lower layer include titanium (Ti), and an intermediate layer includes aluminum (Al).

6. The display device of claim 3, wherein the pixel electrode has the triple layer structure including the upper layer, an intermediate layer, and the lower layer.

7. The display device of claim 3, wherein the gate conductor has the triple layer structure including the upper layer, the intermediate layer, and the lower layer.

8. The display device of claim 1, wherein the data conductor in the first display area has a triple layer structure in which an upper layer and a lower layer include titanium (Ti), and an intermediate layer includes aluminum (Al).

9. The display device of claim 1, wherein the second display area comprises a transmittance region.

10. A display device comprising:
    a substrate including a first display area and a second display area;
    an optical element which overlaps the second display area;
    a scan line disposed on the substrate, and extending in a first direction;
    a data line and a driving voltage line which extend in a second direction perpendicular to the first direction;
    a driving transistor including a first electrode electrically connected to the driving voltage line, and a first gate electrode;
    a second transistor including a first electrode connected to the data line; and
    a pixel electrode electrically connected with the driving transistor,
    wherein the data line and the driving voltage line disposed in the first display area comprise an opaque conductor, and
    at least one selected from the data line and the driving voltage line disposed in the second display area comprises a transparent conductor.

11. The display device of claim 10, wherein
    the data line in the second display area comprises a wiring portion extending in the second direction, and a second transistor connection portion connected to the first electrode of the second transistor.

12. The display device of claim 11, wherein
    the wiring portion of the data line comprises the transparent conductor, and
    the second transistor connection portion of the data line comprises the opaque conductor.

13. The display device of claim 10, further comprising:
    a third transistor including a first electrode connected to the driving voltage line.

14. The display device of claim 13, wherein the driving voltage line comprises a horizontal wiring portion extending in the first direction, a vertical wiring portion extending in the second direction, an electrode island connection portion, a sustain electrode connection portion, and a third transistor connection portion.

15. The display device of claim 14, wherein
    each of the horizontal wiring portion and the vertical wiring portion of the driving voltage line comprises the transparent conductor, and
    the electrode island connection portion, the sustain electrode connection portion, and the third transistor connection portion comprise the opaque conductor.

16. The display device of claim 15, wherein the horizontal wiring portion is electrically connected to the sustain electrode connection portion by directly contacting the horizontal wiring portion.

17. The display device of claim 16, wherein the sustain electrode forms a storage capacitor with the first gate electrode, and an insulation layer interposed therebetween.

18. The display device of claim 15, wherein
    the vertical wiring portion comprises a first vertical wiring portion and a second vertical wiring portion, the first vertical wiring portion is electrically connected to the electrode island connection portion by directly contacting the electrode island connection portion, and the second vertical wiring portion is electrically connected to the third transistor connection portion by directly contacting the third transistor connection portion.

19. The display device of claim 18, wherein the electrode island connection portion is electrically connected to an electrode island through an opening in an insulation layer.

20. The display device of claim 18, wherein the third transistor connection portion is electrically connected to a first electrode of the third transistor through an opening in an insulation layer.

\* \* \* \* \*